(12) United States Patent
Pinto et al.

(10) Patent No.: US 11,082,010 B2
(45) Date of Patent: Aug. 3, 2021

(54) SYSTEMS AND METHODS FOR TIA BASE CURRENT DETECTION AND COMPENSATION

(71) Applicant: Velodyne LiDAR, Inc., San Jose, CA (US)

(72) Inventors: Roger Pinto, Alameda, CA (US); Pravin Kumar Venkatesan, Fremont, CA (US)

(73) Assignee: VELODYNE LIDAR USA, INC., San Jose, CA (US)

( * ) Notice: Subject to any disclaimer, the term of this patent is extended or adjusted under 35 U.S.C. 154(b) by 0 days.

(21) Appl. No.: 16/181,523

(22) Filed: Nov. 6, 2018

(65) Prior Publication Data

US 2020/0144971 A1 May 7, 2020

(51) Int. Cl.
*H03F 3/08* (2006.01)
*H03F 1/30* (2006.01)
(Continued)

(52) U.S. Cl.
CPC ........... *H03F 1/302* (2013.01); *H03F 3/3432* (2013.01); *H03G 3/001* (2013.01); *H03G 3/007* (2013.01); *H03G 3/3089* (2013.01); *H03M 1/742* (2013.01)

(58) Field of Classification Search
CPC .......... H03F 1/302; H03F 3/3432; H03F 1/30; H03F 1/301; H03F 3/04; H03F 2200/447;
(Continued)

(56) References Cited

U.S. PATENT DOCUMENTS 3,064,252 A 11/1962 Varela
3,373,441 A 3/1968 Zadig
(Continued)

FOREIGN PATENT DOCUMENTS

CA 2089105 A1 8/1994
CH 641583 A5 2/1984
(Continued)

OTHER PUBLICATIONS

U.S. Appl. No. 15/941,302, filed Mar. 30, 2018, Hall et al.
(Continued)

*Primary Examiner* — Khanh V Nguyen
(74) *Attorney, Agent, or Firm* — Goodwin Procter LLP

(57) ABSTRACT

Described herein are systems and methods that can adjust the performance of a transimpedance amplifier (TIA) in order to compensate for changing environmental and/or manufacturing conditions. In some embodiments, the changing environmental and/or manufacturing conditions may cause a reduction in beta of a bipolar junction transistor (BJT) in the TIA. A low beta may result in a high base current for the BJT causing the output voltage of the TIA to be formatted as an unusable signal output. To compensate for the low beta, the TIA generates an intermediate signal voltage, based on the base current and beta that is compared with the PN junction bias voltage on another BJT. Based on the comparison, the state of a digital state machine may be incremented, and a threshold base current is determined. This threshold base current may decide whether to compensate the operation of the TIA, or discard the chip.

21 Claims, 6 Drawing Sheets

(51) Int. Cl.
*H03G 3/00* (2006.01)
*H03F 3/343* (2006.01)
*H03G 3/30* (2006.01)
*H03M 1/74* (2006.01)

(58) Field of Classification Search
CPC ............ H03F 3/45479; H03F 3/45071; H03F 3/45085; H03F 1/307; H03F 1/3217; H03F 3/26; H03M 1/742; H03G 3/001; H03G 3/3089; H03G 3/007
USPC .................................. 330/256, 266, 272, 289
See application file for complete search history.

(56) References Cited

U.S. PATENT DOCUMENTS

| | | |
|---|---|---|
| 3,551,845 A | 12/1970 | Zelina |
| 3,636,250 A | 1/1972 | Haeff |
| 3,686,514 A | 8/1972 | Dube et al. |
| 3,781,111 A | 12/1973 | Fletcher et al. |
| 3,862,415 A | 1/1975 | Harnden, Jr. et al. |
| 3,897,150 A | 7/1975 | Bridges et al. |
| 3,921,081 A | 11/1975 | Lane |
| 4,179,216 A | 12/1979 | Theurer et al. |
| 4,199,697 A | 4/1980 | Edwards |
| 4,201,442 A | 5/1980 | McMahon et al. |
| 4,212,534 A | 7/1980 | Bodlaj |
| 4,220,103 A | 9/1980 | Kasahara et al. |
| 4,477,184 A | 10/1984 | Endo |
| 4,516,837 A | 5/1985 | Soref et al. |
| 4,634,272 A | 1/1987 | Endo |
| 4,656,462 A | 4/1987 | Araki et al. |
| 4,681,433 A | 7/1987 | Aeschlimann |
| 4,700,301 A | 10/1987 | Dyke |
| 4,730,932 A | 3/1988 | Iga et al. |
| 4,742,337 A | 5/1988 | Haag |
| 4,834,531 A | 5/1989 | Ward |
| 4,862,257 A | 8/1989 | Ulich |
| 4,895,440 A | 1/1990 | Cain et al. |
| 4,896,343 A | 1/1990 | Saunders |
| 4,902,126 A | 2/1990 | Koechner |
| 4,944,036 A | 7/1990 | Hyatt |
| 4,952,911 A | 8/1990 | D'Ambrosia et al. |
| 4,967,183 A | 10/1990 | D'Ambrosia et al. |
| 5,004,916 A | 4/1991 | Collins, Jr. |
| 5,006,721 A | 4/1991 | Cameron et al. |
| 5,023,888 A | 6/1991 | Bayston |
| 5,026,156 A | 6/1991 | Bayston et al. |
| 5,033,819 A | 7/1991 | Tanaka |
| 5,059,008 A | 10/1991 | Flood et al. |
| 5,175,694 A | 12/1992 | Amato |
| 5,177,768 A | 1/1993 | Crespo et al. |
| 5,210,586 A | 5/1993 | Grage et al. |
| 5,212,533 A | 5/1993 | Shibuya et al. |
| 5,241,481 A | 8/1993 | Olsen |
| 5,249,157 A | 9/1993 | Taylor |
| 5,291,261 A | 3/1994 | Dahl et al. |
| 5,309,212 A | 5/1994 | Clark |
| 5,314,037 A | 5/1994 | Shaw et al. |
| 5,319,201 A | 6/1994 | Lee |
| 5,357,331 A | 10/1994 | Flockencier |
| 5,365,218 A | 11/1994 | Otto |
| 5,463,384 A | 10/1995 | Juds |
| 5,465,142 A | 11/1995 | Krumes et al. |
| 5,515,156 A | 5/1996 | Yoshida et al. |
| 5,546,188 A | 8/1996 | Wangler et al. |
| 5,563,706 A | 10/1996 | Shibuya et al. |
| 5,572,219 A | 11/1996 | Silverstein et al. |
| 5,691,687 A | 11/1997 | Kumagai et al. |
| 5,710,417 A | 1/1998 | Joseph et al. |
| 5,757,472 A | 5/1998 | Wangler et al. |
| 5,757,501 A | 5/1998 | Hipp |
| 5,757,677 A | 5/1998 | Lennen |
| 5,789,739 A | 8/1998 | Schwarz |
| 5,793,163 A | 8/1998 | Okuda |
| 5,793,491 A | 8/1998 | Wangler et al. |
| 5,805,468 A | 9/1998 | Blohbaum |
| 5,847,815 A | 12/1998 | Albouy et al. |
| 5,847,817 A | 12/1998 | Zediker et al. |
| 5,877,688 A | 3/1999 | Morinaka et al. |
| 5,889,479 A | 3/1999 | Tabel |
| 5,895,984 A | 4/1999 | Renz |
| 5,903,355 A | 5/1999 | Schwarz |
| 5,903,386 A | 5/1999 | Mantravadi et al. |
| 5,923,910 A | 7/1999 | Nakahara et al. |
| 5,942,688 A | 8/1999 | Kimura et al. |
| 5,949,530 A | 9/1999 | Wetteborn |
| 5,953,110 A | 9/1999 | Burns |
| 5,991,011 A | 11/1999 | Damm |
| 6,034,803 A | 3/2000 | Sullivan et al. |
| 6,043,868 A | 3/2000 | Dunne |
| 6,069,565 A | 5/2000 | Stern et al. |
| 6,088,085 A | 7/2000 | Wetteborn |
| 6,091,071 A | 7/2000 | Franz et al. |
| 6,100,539 A | 8/2000 | Blumcke et al. |
| 6,137,566 A | 10/2000 | Leonard et al. |
| 6,153,878 A | 11/2000 | Jakob et al. |
| 6,157,294 A | 12/2000 | Urai et al. |
| 6,201,236 B1 | 3/2001 | Juds |
| 6,259,714 B1 | 7/2001 | Kinbara |
| 6,297,844 B1 | 10/2001 | Schatz et al. |
| 6,321,172 B1 | 11/2001 | Jakob et al. |
| 6,327,806 B1 | 12/2001 | Paige |
| 6,329,800 B1 | 12/2001 | May |
| 6,335,789 B1 | 1/2002 | Kikuchi |
| 6,365,429 B1 | 4/2002 | Kneissl et al. |
| 6,396,577 B1 | 5/2002 | Ramstack |
| 6,420,698 B1 | 7/2002 | Dimsdale |
| 6,441,363 B1 | 8/2002 | Cook, Jr. et al. |
| 6,441,889 B1 | 8/2002 | Patterson |
| 6,442,476 B1 | 8/2002 | Poropat |
| 6,473,079 B1 | 10/2002 | Kacyra et al. |
| 6,504,712 B2 | 1/2003 | Hashimoto et al. |
| 6,509,958 B2 | 1/2003 | Pierenkemper |
| 6,593,582 B2 | 7/2003 | Lee et al. |
| 6,621,764 B1 | 9/2003 | Smith |
| 6,636,300 B2 | 10/2003 | Doemens et al. |
| 6,646,725 B1 | 11/2003 | Eichinger et al. |
| 6,650,402 B2 | 11/2003 | Sullivan et al. |
| 6,664,529 B2 | 12/2003 | Pack et al. |
| 6,665,063 B2 | 12/2003 | Jamieson et al. |
| 6,670,905 B1 | 12/2003 | Orr |
| 6,682,478 B2 | 1/2004 | Nakamura |
| 6,687,373 B1 | 2/2004 | Yeh et al. |
| 6,710,324 B2 | 3/2004 | Hipp |
| 6,742,707 B1 | 6/2004 | Tsikos et al. |
| 6,747,747 B2 | 6/2004 | Hipp |
| 6,759,649 B2 | 7/2004 | Hipp |
| 6,789,527 B2 | 9/2004 | Sauler et al. |
| 6,798,527 B2 | 9/2004 | Fukumoto et al. |
| 6,812,450 B2 | 11/2004 | Hipp |
| 6,876,790 B2 | 4/2005 | Lee |
| 6,879,419 B2 | 4/2005 | Richman et al. |
| 6,969,558 B2 | 11/2005 | Walston et al. |
| 7,030,968 B2 | 4/2006 | D'Aligny et al. |
| 7,041,962 B2 | 5/2006 | Dollmann et al. |
| 7,089,114 B1 | 8/2006 | Huang |
| 7,106,424 B2 | 9/2006 | Meneely et al. |
| 7,129,971 B2 | 10/2006 | McCutchen |
| 7,130,672 B2 | 10/2006 | Pewzner et al. |
| 7,131,586 B2 | 11/2006 | Tsikos et al. |
| 7,190,465 B2 | 3/2007 | Froehlich et al. |
| 7,240,314 B1 | 7/2007 | Leung |
| 7,248,342 B1 | 7/2007 | Degnan |
| 7,281,891 B2 | 10/2007 | Smith et al. |
| 7,295,298 B2 | 11/2007 | Willhoeft et al. |
| 7,313,424 B2 | 12/2007 | Mayevsky et al. |
| 7,315,377 B2 | 1/2008 | Holland et al. |
| 7,319,777 B2 | 1/2008 | Morcom |
| 7,345,271 B2 | 3/2008 | Boehlau et al. |
| 7,358,819 B2 | 4/2008 | Rollins |
| 7,373,473 B2 | 5/2008 | Bukowski et al. |
| 7,408,462 B2 | 8/2008 | Pirkl et al. |
| 7,477,360 B2 | 1/2009 | England et al. |

(56) References Cited

U.S. PATENT DOCUMENTS

| | | | |
|---|---|---|---|
| 7,480,031 B2 | 1/2009 | Mack | |
| 7,544,945 B2 | 6/2009 | Tan et al. | |
| 7,570,793 B2 | 8/2009 | Lages et al. | |
| 7,583,364 B1 | 9/2009 | Mayor et al. | |
| 7,589,826 B2 | 9/2009 | Mack et al. | |
| 7,619,477 B2 * | 11/2009 | Segarra | G01R 19/32 330/129 |
| 7,623,222 B2 | 11/2009 | Benz et al. | |
| 7,640,068 B2 | 12/2009 | Johnson et al. | |
| 7,642,946 B2 * | 1/2010 | Wong | H03M 1/002 341/144 |
| 7,684,590 B2 | 3/2010 | Kampchen et al. | |
| 7,697,581 B2 | 4/2010 | Walsh et al. | |
| 7,741,618 B2 | 6/2010 | Lee et al. | |
| 7,746,271 B2 | 6/2010 | Furstenberg | |
| 7,868,665 B2 | 1/2011 | Tumer et al. | |
| 7,944,548 B2 | 5/2011 | Eaton | |
| 7,969,558 B2 | 6/2011 | Hall | |
| 8,042,056 B2 | 10/2011 | Wheeler et al. | |
| 8,072,582 B2 | 12/2011 | Meneely | |
| 8,077,047 B2 | 12/2011 | Humble et al. | |
| 8,139,685 B2 | 3/2012 | Simic et al. | |
| 8,203,702 B1 | 6/2012 | Kane et al. | |
| 8,274,037 B2 | 9/2012 | Ritter et al. | |
| 8,310,653 B2 | 11/2012 | Ogawa et al. | |
| 8,451,432 B2 | 5/2013 | Crawford et al. | |
| 8,605,262 B2 | 12/2013 | Campbell et al. | |
| 8,675,181 B2 | 3/2014 | Hall | |
| 8,736,818 B2 | 5/2014 | Weimer et al. | |
| 8,767,190 B2 | 7/2014 | Hall | |
| 8,875,409 B2 | 11/2014 | Kretschmer et al. | |
| 8,976,340 B2 | 3/2015 | Gilliland et al. | |
| 8,995,478 B1 | 3/2015 | Kobtsev et al. | |
| 9,059,562 B2 | 6/2015 | Priest et al. | |
| 9,063,549 B1 | 6/2015 | Pennecot et al. | |
| 9,069,061 B1 | 6/2015 | Harwit | |
| 9,069,080 B2 | 6/2015 | Stettner et al. | |
| 9,086,273 B1 | 7/2015 | Gruver et al. | |
| 9,093,969 B2 | 7/2015 | Gebeyehu et al. | |
| 9,110,154 B1 | 8/2015 | Bates et al. | |
| 9,151,940 B2 | 10/2015 | Chuang et al. | |
| 9,191,260 B1 | 11/2015 | Grund | |
| 9,194,701 B2 | 11/2015 | Bosch | |
| RE45,854 E | 1/2016 | Gittinger et al. | |
| 9,239,959 B1 | 1/2016 | Evans et al. | |
| 9,246,041 B1 | 1/2016 | Clausen et al. | |
| 9,250,327 B2 | 2/2016 | Kelley et al. | |
| 9,285,477 B1 | 3/2016 | Smith et al. | |
| 9,286,538 B1 | 3/2016 | Chen et al. | |
| 9,310,197 B2 | 4/2016 | Gogolla et al. | |
| 9,383,753 B1 | 7/2016 | Templeton et al. | |
| 9,453,914 B2 | 9/2016 | Stettner et al. | |
| 9,529,079 B1 | 12/2016 | Droz et al. | |
| 9,772,607 B2 | 9/2017 | Decoux et al. | |
| RE46,672 E | 1/2018 | Hall | |
| 9,964,632 B1 | 5/2018 | Droz et al. | |
| 9,983,297 B2 | 5/2018 | Hall et al. | |
| 9,989,629 B1 | 6/2018 | LaChapelle | |
| 10,003,168 B1 | 6/2018 | Villeneuve | |
| 10,018,726 B2 | 7/2018 | Hall et al. | |
| 10,048,374 B2 | 8/2018 | Hall et al. | |
| 10,094,925 B1 | 10/2018 | LaChapelle | |
| 10,109,183 B1 | 10/2018 | Franz et al. | |
| 10,120,079 B2 | 11/2018 | Pennecot et al. | |
| 10,126,412 B2 | 11/2018 | Eldada et al. | |
| 10,132,928 B2 | 11/2018 | Eldada et al. | |
| 10,309,213 B2 | 6/2019 | Barfoot et al. | |
| 10,330,780 B2 | 6/2019 | Hall et al. | |
| 10,386,465 B2 | 8/2019 | Hall et al. | |
| 10,393,874 B2 | 8/2019 | Schmidtke et al. | |
| 10,393,877 B2 | 8/2019 | Hall et al. | |
| 10,436,904 B2 | 10/2019 | Moss et al. | |
| 10,545,222 B2 | 1/2020 | Hall et al. | |
| RE47,942 E | 4/2020 | Hall | |
| 10,613,203 B1 | 4/2020 | Rekow et al. | |
| 10,627,490 B2 | 4/2020 | Hall et al. | |
| 10,627,491 B2 | 4/2020 | Hall et al. | |
| 10,712,434 B2 | 7/2020 | Hall et al. | |
| 2001/0011289 A1 | 8/2001 | Davis et al. | |
| 2001/0017718 A1 | 8/2001 | Ikeda et al. | |
| 2002/0003617 A1 | 1/2002 | Doemens et al. | |
| 2002/0060784 A1 | 5/2002 | Pack et al. | |
| 2002/0117545 A1 | 8/2002 | Tsikos et al. | |
| 2003/0041079 A1 | 2/2003 | Bellemore et al. | |
| 2003/0043363 A1 | 3/2003 | Jamieson et al. | |
| 2003/0043364 A1 | 3/2003 | Jamieson et al. | |
| 2003/0057533 A1 | 3/2003 | Lemmi et al. | |
| 2003/0066977 A1 | 4/2003 | Hipp et al. | |
| 2003/0076485 A1 | 4/2003 | Ruff et al. | |
| 2003/0090646 A1 | 5/2003 | Riegl et al. | |
| 2003/0163030 A1 | 8/2003 | Arriaga | |
| 2004/0021852 A1 | 2/2004 | DeFlumere | |
| 2004/0066500 A1 | 4/2004 | Gokturk et al. | |
| 2004/0134879 A1 | 7/2004 | Kochergin et al. | |
| 2004/0150810 A1 | 8/2004 | Muenter et al. | |
| 2004/0213463 A1 | 10/2004 | Morrison | |
| 2004/0240706 A1 | 12/2004 | Wallace et al. | |
| 2004/0240710 A1 | 12/2004 | Lages et al. | |
| 2004/0247157 A1 | 12/2004 | Lages et al. | |
| 2005/0023353 A1 | 2/2005 | Tsikos et al. | |
| 2005/0168720 A1 | 8/2005 | Yamashita et al. | |
| 2005/0211893 A1 | 9/2005 | Paschalidis | |
| 2005/0232466 A1 | 10/2005 | Kampchen et al. | |
| 2005/0246065 A1 | 11/2005 | Ricard | |
| 2005/0248749 A1 | 11/2005 | Kiehn et al. | |
| 2005/0279914 A1 | 12/2005 | Dimsdale et al. | |
| 2006/0007350 A1 | 1/2006 | Gao et al. | |
| 2006/0073621 A1 | 4/2006 | Kneissel et al. | |
| 2006/0089765 A1 | 4/2006 | Pack et al. | |
| 2006/0100783 A1 | 5/2006 | Haberer et al. | |
| 2006/0115113 A1 | 6/2006 | Lages et al. | |
| 2006/0132635 A1 | 6/2006 | Land | |
| 2006/0176697 A1 | 8/2006 | Arruda | |
| 2006/0186326 A1 | 8/2006 | Ito | |
| 2006/0197867 A1 | 9/2006 | Johnson et al. | |
| 2006/0231771 A1 | 10/2006 | Lee et al. | |
| 2006/0290920 A1 | 12/2006 | Kampchen et al. | |
| 2007/0035624 A1 | 2/2007 | Lubard et al. | |
| 2007/0071056 A1 | 3/2007 | Chen | |
| 2007/0121095 A1 | 5/2007 | Lewis | |
| 2007/0181810 A1 | 8/2007 | Tan et al. | |
| 2007/0201027 A1 | 8/2007 | Doushkina et al. | |
| 2007/0219720 A1 | 9/2007 | Trepagnier et al. | |
| 2007/0241955 A1 | 10/2007 | Brosche | |
| 2007/0272841 A1 | 11/2007 | Wiklof | |
| 2008/0002176 A1 | 1/2008 | Krasutsky | |
| 2008/0013896 A1 | 1/2008 | Salzberg et al. | |
| 2008/0074640 A1 | 3/2008 | Walsh et al. | |
| 2008/0079371 A1 | 4/2008 | Kang et al. | |
| 2008/0154495 A1 | 6/2008 | Breed | |
| 2008/0170826 A1 | 7/2008 | Schaafsma | |
| 2008/0186501 A1 | 8/2008 | Xie | |
| 2008/0302971 A1 | 12/2008 | Hyde et al. | |
| 2009/0010644 A1 | 1/2009 | Varshneya et al. | |
| 2009/0026503 A1 | 1/2009 | Tsuda | |
| 2009/0085901 A1 | 4/2009 | Antony | |
| 2009/0122295 A1 | 5/2009 | Eaton | |
| 2009/0142053 A1 | 6/2009 | Varshneya et al. | |
| 2009/0168045 A1 | 7/2009 | Lin et al. | |
| 2009/0218475 A1 | 9/2009 | Kawakami et al. | |
| 2009/0245788 A1 | 10/2009 | Varshneya et al. | |
| 2009/0323737 A1 | 12/2009 | Ensher et al. | |
| 2010/0006760 A1 | 1/2010 | Lee et al. | |
| 2010/0020306 A1 | 1/2010 | Hall | |
| 2010/0045965 A1 | 2/2010 | Meneely | |
| 2010/0046953 A1 | 2/2010 | Shaw et al. | |
| 2010/0067070 A1 | 3/2010 | Mamada et al. | |
| 2010/0073780 A1 | 3/2010 | Ito | |
| 2010/0074532 A1 | 3/2010 | Gordon et al. | |
| 2010/0134596 A1 | 6/2010 | Becker | |
| 2010/0188722 A1 | 7/2010 | Yamada et al. | |
| 2010/0198487 A1 | 8/2010 | Vollmer et al. | |
| 2010/0204964 A1 | 8/2010 | Pack et al. | |
| 2010/0239139 A1 | 9/2010 | Hunt et al. | |

(56) References Cited

U.S. PATENT DOCUMENTS

| | | |
|---|---|---|
| 2010/0265077 A1 | 10/2010 | Humble et al. |
| 2010/0271615 A1 | 10/2010 | Sebastian et al. |
| 2010/0302528 A1 | 12/2010 | Hall |
| 2011/0028859 A1 | 2/2011 | Chian |
| 2011/0040482 A1 | 2/2011 | Brimble et al. |
| 2011/0176183 A1 | 7/2011 | Ikeda et al. |
| 2011/0211188 A1 | 9/2011 | Juenemann et al. |
| 2011/0216304 A1 | 9/2011 | Hall |
| 2011/0305250 A1 | 12/2011 | Chann et al. |
| 2012/0038903 A1 | 2/2012 | Weimer et al. |
| 2012/0195597 A1 | 8/2012 | Malaney |
| 2012/0287417 A1 | 11/2012 | Mimeault |
| 2013/0024176 A2 | 1/2013 | Woodford |
| 2013/0038915 A1 | 2/2013 | Kusaka et al. |
| 2013/0050144 A1 | 2/2013 | Reynolds |
| 2013/0050486 A1 | 2/2013 | Omer et al. |
| 2013/0070239 A1 | 3/2013 | Crawford et al. |
| 2013/0093583 A1 | 4/2013 | Shapiro |
| 2013/0094960 A1 | 4/2013 | Bowyer et al. |
| 2013/0151198 A1 | 6/2013 | Brown |
| 2013/0168673 A1 | 7/2013 | Yu et al. |
| 2013/0206967 A1 | 8/2013 | Shpunt et al. |
| 2013/0241761 A1 | 9/2013 | Cooper et al. |
| 2013/0242283 A1 | 9/2013 | Bailey et al. |
| 2013/0258312 A1 | 10/2013 | Lewis |
| 2013/0286404 A1 | 10/2013 | Cenko et al. |
| 2013/0300479 A1 | 11/2013 | Thibault |
| 2013/0314711 A1 | 11/2013 | Cantin et al. |
| 2013/0336375 A1 | 12/2013 | Ranki et al. |
| 2013/0342366 A1 | 12/2013 | Kiefer et al. |
| 2014/0063189 A1 | 3/2014 | Zheleznyak et al. |
| 2014/0063483 A1 | 3/2014 | Li |
| 2014/0071234 A1 | 3/2014 | Millett |
| 2014/0078519 A1 | 3/2014 | Steffey et al. |
| 2014/0104592 A1 | 4/2014 | Tien et al. |
| 2014/0176657 A1 | 6/2014 | Nemoto |
| 2014/0240317 A1 | 8/2014 | Go et al. |
| 2014/0240721 A1 | 8/2014 | Herschbach |
| 2014/0253369 A1 | 9/2014 | Kelley et al. |
| 2014/0259715 A1 | 9/2014 | Engel |
| 2014/0267848 A1 | 9/2014 | Wu |
| 2014/0274093 A1 | 9/2014 | Abdelmonem |
| 2014/0347650 A1 | 11/2014 | Bosch |
| 2015/0015895 A1 | 1/2015 | Bridges et al. |
| 2015/0035437 A1 | 2/2015 | Panopoulos et al. |
| 2015/0055117 A1 | 2/2015 | Pennecot et al. |
| 2015/0101234 A1 | 4/2015 | Priest et al. |
| 2015/0116695 A1 | 4/2015 | Bartolome et al. |
| 2015/0131080 A1 | 5/2015 | Retterath et al. |
| 2015/0144806 A1 | 5/2015 | Jin et al. |
| 2015/0185325 A1 | 7/2015 | Park et al. |
| 2015/0202939 A1 | 7/2015 | Stettner et al. |
| 2015/0219764 A1 | 8/2015 | Lipson |
| 2015/0219765 A1 | 8/2015 | Mead et al. |
| 2015/0226853 A1 | 8/2015 | Seo et al. |
| 2015/0293224 A1 | 10/2015 | Eldada et al. |
| 2015/0293228 A1 | 10/2015 | Retterath et al. |
| 2015/0303216 A1 | 10/2015 | Tamaru |
| 2016/0003946 A1 | 1/2016 | Gilliland et al. |
| 2016/0009410 A1 | 1/2016 | Derenick et al. |
| 2016/0014309 A1 | 1/2016 | Ellison et al. |
| 2016/0021713 A1 | 1/2016 | Reed |
| 2016/0049058 A1 | 2/2016 | Allen et al. |
| 2016/0098620 A1 | 4/2016 | Geile |
| 2016/0117431 A1 | 4/2016 | Kim et al. |
| 2016/0154105 A1 | 6/2016 | Sigmund et al. |
| 2016/0161600 A1 | 6/2016 | Eldada et al. |
| 2016/0191173 A1 | 6/2016 | Malaney |
| 2016/0209499 A1 | 7/2016 | Suzuki |
| 2016/0245919 A1 | 8/2016 | Kalscheur et al. |
| 2016/0259038 A1 | 9/2016 | Retterath et al. |
| 2016/0279808 A1 | 9/2016 | Doughty et al. |
| 2016/0300484 A1 | 10/2016 | Torbett |
| 2016/0306032 A1 | 10/2016 | Schwarz et al. |
| 2016/0313445 A1 | 10/2016 | Bailey et al. |
| 2016/0363659 A1 | 12/2016 | Mindell et al. |
| 2016/0365846 A1 | 12/2016 | Wyland |
| 2017/0146639 A1 | 5/2017 | Carothers |
| 2017/0146640 A1 | 5/2017 | Hall et al. |
| 2017/0153319 A1 | 6/2017 | Villeneuve et al. |
| 2017/0214861 A1 | 7/2017 | Rachlin et al. |
| 2017/0219695 A1 | 8/2017 | Hall et al. |
| 2017/0220876 A1 | 8/2017 | Gao et al. |
| 2017/0242102 A1 | 8/2017 | Dussan et al. |
| 2017/0269198 A1 | 9/2017 | Hall et al. |
| 2017/0269209 A1 | 9/2017 | Hall et al. |
| 2017/0269215 A1 | 9/2017 | Hall et al. |
| 2017/0299721 A1 | 10/2017 | Eichenholz et al. |
| 2017/0350983 A1 | 12/2017 | Hall et al. |
| 2018/0019155 A1 | 1/2018 | Tsang et al. |
| 2018/0058197 A1 | 3/2018 | Barfoot et al. |
| 2018/0059219 A1 | 3/2018 | Irish et al. |
| 2018/0074382 A1 | 3/2018 | Lee et al. |
| 2018/0100924 A1 | 4/2018 | Brinkmeyer |
| 2018/0106902 A1 | 4/2018 | Mase et al. |
| 2018/0131449 A1 | 5/2018 | Kare et al. |
| 2018/0168539 A1 | 6/2018 | Singh et al. |
| 2018/0267151 A1 | 9/2018 | Hall et al. |
| 2018/0275249 A1 | 9/2018 | Campbell et al. |
| 2018/0284227 A1 | 10/2018 | Hall et al. |
| 2018/0284274 A1 | 10/2018 | LaChapelle |
| 2018/0321360 A1 | 11/2018 | Hall et al. |
| 2018/0364098 A1 | 12/2018 | McDaniel et al. |
| 2019/0001442 A1 | 1/2019 | Unrath et al. |
| 2019/0011563 A1 | 1/2019 | Hall et al. |
| 2019/0178991 A1 | 6/2019 | Hall et al. |
| 2019/0293764 A1 | 9/2019 | Van Nieuwenhove et al. |
| 2019/0339365 A1 | 11/2019 | Hall et al. |
| 2019/0361092 A1 | 11/2019 | Hall et al. |
| 2019/0369257 A1 | 12/2019 | Hall et al. |
| 2019/0369258 A1 | 12/2019 | Hall et al. |
| 2020/0025896 A1 | 1/2020 | Gunnam |
| 2020/0064452 A1 | 2/2020 | Avlas et al. |
| 2020/0142070 A1 | 5/2020 | Hall et al. |
| 2020/0144971 A1 | 5/2020 | Pinto et al. |
| 2020/0166613 A1 | 5/2020 | Hall et al. |
| 2020/0191915 A1 | 6/2020 | Hall et al. |
| 2020/0249321 A1 | 8/2020 | Hall et al. |
| 2020/0319311 A1 | 10/2020 | Hall et al. |

FOREIGN PATENT DOCUMENTS

| | | |
|---|---|---|
| CN | 1106534 A | 8/1995 |
| CN | 1576123 A | 2/2005 |
| CN | 2681085 Y | 2/2005 |
| CN | 2773714 Y | 4/2006 |
| CN | 103278808 B | 12/2015 |
| CN | 107037444 A | 8/2017 |
| CN | 206773192 U | 12/2017 |
| CN | 108061884 A | 5/2018 |
| CN | 207457499 U | 6/2018 |
| CN | 207457508 U | 6/2018 |
| CN | 109116367 A | 1/2019 |
| CN | 106443699 B | 2/2019 |
| CN | 106597471 B | 5/2019 |
| CN | 208902906 U | 5/2019 |
| DE | 930909 C | 7/1955 |
| DE | 3134815 A1 | 3/1983 |
| DE | 3216312 A1 | 11/1983 |
| DE | 3216313 A1 | 11/1983 |
| DE | 3701340 A1 | 7/1988 |
| DE | 3741259 A1 | 6/1989 |
| DE | 3808972 A1 | 10/1989 |
| DE | 3821892 C1 | 2/1990 |
| DE | 4040894 C1 | 4/1992 |
| DE | 4115747 A1 | 11/1992 |
| DE | 4124192 A1 | 1/1993 |
| DE | 4127168 A1 | 2/1993 |
| DE | 4137550 A1 | 3/1993 |
| DE | 4215272 A1 | 11/1993 |
| DE | 4243631 A1 | 6/1994 |
| DE | 4340756 A1 | 6/1994 |
| DE | 4411448 A1 | 10/1995 |
| DE | 4412044 A1 | 10/1995 |

(56) References Cited

FOREIGN PATENT DOCUMENTS

| | | |
|---|---|---|
| DE | 19512644 A1 | 10/1996 |
| DE | 19512681 A1 | 10/1996 |
| DE | 4345446 C2 | 7/1998 |
| DE | 4345448 C2 | 7/1998 |
| DE | 19727792 A1 | 2/1999 |
| DE | 19741730 A1 | 4/1999 |
| DE | 19741731 A1 | 4/1999 |
| DE | 19752145 A1 | 5/1999 |
| DE | 19717399 A1 | 6/1999 |
| DE | 19757847 A1 | 7/1999 |
| DE | 19757848 A1 | 7/1999 |
| DE | 19757849 A1 | 7/1999 |
| DE | 19757840 C1 | 9/1999 |
| DE | 19815149 A1 | 10/1999 |
| DE | 19828000 A1 | 1/2000 |
| DE | 19902903 C1 | 5/2000 |
| DE | 19911375 A1 | 9/2000 |
| DE | 19919925 A1 | 11/2000 |
| DE | 19927501 A1 | 11/2000 |
| DE | 19936440 A1 | 3/2001 |
| DE | 19953006 A1 | 5/2001 |
| DE | 19953007 A1 | 5/2001 |
| DE | 19953009 A1 | 5/2001 |
| DE | 19953010 A1 | 5/2001 |
| DE | 10025511 C1 | 12/2001 |
| DE | 10110420 A1 | 9/2002 |
| DE | 10114362 A1 | 10/2002 |
| DE | 10127417 A1 | 12/2002 |
| DE | 10128954 A1 | 12/2002 |
| DE | 10141055 A1 | 3/2003 |
| DE | 10143060 A1 | 3/2003 |
| DE | 10146692 A1 | 4/2003 |
| DE | 10148070 A1 | 4/2003 |
| DE | 10151983 A1 | 4/2003 |
| DE | 10162668 A1 | 7/2003 |
| DE | 10217295 A1 | 11/2003 |
| DE | 10222797 A1 | 12/2003 |
| DE | 10229408 A1 | 1/2004 |
| DE | 10244638 A1 | 4/2004 |
| DE | 10244640 A1 | 4/2004 |
| DE | 10244643 A1 | 4/2004 |
| DE | 10258794 A1 | 6/2004 |
| DE | 10303015 A1 | 8/2004 |
| DE | 10331529 A1 | 1/2005 |
| DE | 10341548 A1 | 3/2005 |
| DE | 102004010197 A1 | 9/2005 |
| DE | 102004014041 A1 | 10/2005 |
| DE | 102005050824 A1 | 5/2006 |
| DE | 102005003827 A1 | 7/2006 |
| DE | 102005019233 A1 | 11/2006 |
| DE | 102007013023 A1 | 9/2008 |
| DE | 202015009250 U1 | 1/2017 |
| EP | 0185816 A1 | 7/1986 |
| EP | 0361188 A2 | 4/1990 |
| EP | 0396865 A2 | 11/1990 |
| EP | 0412395 A1 | 2/1991 |
| EP | 0412398 A1 | 2/1991 |
| EP | 0412399 A1 | 2/1991 |
| EP | 0412400 A1 | 2/1991 |
| EP | 0468175 A2 | 1/1992 |
| EP | 0486430 A2 | 5/1992 |
| EP | 0653720 A2 | 5/1995 |
| EP | 0656868 A1 | 6/1995 |
| EP | 0897120 A2 | 2/1999 |
| EP | 0913707 A1 | 5/1999 |
| EP | 0937996 A2 | 8/1999 |
| EP | 0967492 A1 | 12/1999 |
| EP | 1046938 A2 | 10/2000 |
| EP | 1055937 A2 | 11/2000 |
| EP | 1148345 A1 | 10/2001 |
| EP | 1160718 A2 | 12/2001 |
| EP | 1174733 A2 | 1/2002 |
| EP | 1267177 A1 | 12/2002 |
| EP | 1267178 A1 | 12/2002 |
| EP | 1286178 A2 | 2/2003 |
| EP | 1286181 A1 | 2/2003 |
| EP | 1288677 A2 | 3/2003 |
| EP | 1291673 A2 | 3/2003 |
| EP | 1291674 A2 | 3/2003 |
| EP | 1298012 A2 | 4/2003 |
| EP | 1298453 A2 | 4/2003 |
| EP | 1298454 A2 | 4/2003 |
| EP | 1300715 A2 | 4/2003 |
| EP | 1302784 A2 | 4/2003 |
| EP | 1304583 A2 | 4/2003 |
| EP | 1306690 A2 | 5/2003 |
| EP | 1308747 A2 | 5/2003 |
| EP | 1355128 A1 | 10/2003 |
| EP | 1403657 A1 | 3/2004 |
| EP | 1408318 A1 | 4/2004 |
| EP | 1418444 A1 | 5/2004 |
| EP | 1460454 A2 | 9/2004 |
| EP | 1475764 A2 | 11/2004 |
| EP | 1515157 A1 | 3/2005 |
| EP | 1531342 A1 | 5/2005 |
| EP | 1531343 A1 | 5/2005 |
| EP | 1548351 A2 | 6/2005 |
| EP | 1557691 A1 | 7/2005 |
| EP | 1557692 A1 | 7/2005 |
| EP | 1557693 A1 | 7/2005 |
| EP | 1557694 A1 | 7/2005 |
| EP | 1700763 A2 | 9/2006 |
| EP | 1914564 A1 | 4/2008 |
| EP | 1927867 A1 | 6/2008 |
| EP | 1939652 A1 | 7/2008 |
| EP | 1947377 A1 | 7/2008 |
| EP | 1983354 A1 | 10/2008 |
| EP | 2003471 A1 | 12/2008 |
| EP | 2177931 A2 | 4/2010 |
| EP | 2503360 A1 | 9/2012 |
| GB | 2041687 A | 9/1980 |
| JP | H05240940 A | 9/1993 |
| JP | H03-006407 | 2/1994 |
| JP | H6-288725 A | 10/1994 |
| JP | H07-167609 A | 7/1995 |
| JP | 11264871 | 9/1999 |
| JP | 2001216592 A | 8/2001 |
| JP | 2001-256576 A | 9/2001 |
| JP | 2002-031528 A | 1/2002 |
| JP | 2003-336447 A | 11/2003 |
| JP | 2004-348575 A | 12/2004 |
| JP | 2005-070840 A | 3/2005 |
| JP | 2005-297863 A | 10/2005 |
| JP | 2006-177843 A | 7/2006 |
| JP | 2011-069726 A | 4/2011 |
| JP | 2014-190736 A | 10/2014 |
| JP | 2015-169491 A | 9/2015 |
| WO | WO-1999/003080 A1 | 1/1999 |
| WO | WO-2000/025089 A1 | 5/2000 |
| WO | WO-01/31608 A1 | 5/2001 |
| WO | WO-03/019234 A1 | 3/2003 |
| WO | WO-03/040755 A1 | 5/2003 |
| WO | WO-2004/019293 A2 | 3/2004 |
| WO | WO-2004/036245 A2 | 4/2004 |
| WO | WO-2008/008970 A2 | 1/2008 |
| WO | WO-2009/120706 A2 | 10/2009 |
| WO | WO-2012/153309 A2 | 11/2012 |
| WO | WO-2013/191133 A1 | 12/2013 |
| WO | WO-2015/079300 A1 | 6/2015 |
| WO | WO-2015/104572 A1 | 7/2015 |
| WO | WO-2016/162568 A1 | 10/2016 |
| WO | WO-2017/033419 A1 | 3/2017 |
| WO | WO-2017/089063 A1 | 6/2017 |
| WO | WO-2017/132703 A1 | 8/2017 |
| WO | WO-2017/164989 A1 | 9/2017 |
| WO | WO-2017/165316 A1 | 9/2017 |
| WO | WO-2017/193269 A1 | 11/2017 |
| WO | WO-2018/125823 A1 | 7/2018 |
| WO | WO-2018/196001 A1 | 11/2018 |

OTHER PUBLICATIONS

U.S. Appl. No. 16/510,680, filed Jul. 12, 2019, Hall et al.
U.S. Appl. No. 16/510,710, filed Jul. 12, 2019, Hall et al.

(56) References Cited

OTHER PUBLICATIONS

U.S. Appl. No. 16/510,749, filed Jul. 12, 2019, Hall et al.
U.S. Appl. No. 15/420,384, filed Jan. 31, 2017, Hall et al.
U.S. Appl. No. 16/030,780, filed Jul. 9, 2018, Hall et al.
U.S. Appl. No. 11/777,802, filed Jul. 13, 2007, Hall.
U.S. Appl. No. 13/109,901, filed May 17, 2011, Hall et al.
U.S. Appl. No. 15/180,580, filed Jun. 13, 2016, Hall et al.
U.S. Appl. No. 15/700,543, filed Sep. 11, 2017, Hall et al.
U.S. Appl. No. 15/700,558, filed Sep. 11, 2017, Hall et al.
U.S. Appl. No. 15/700,571, filed Sep. 11, 2017, Hall et al.
U.S. Appl. No. 15/700,836, filed Sep. 11, 2017, Hall et al.
U.S. Appl. No. 15/700,844, filed Sep. 11, 2017, Hall et al.
U.S. Appl. No. 15/700,959, filed Sep. 11, 2017, Hall et al.
U.S. Appl. No. 15/700,965, filed Sep. 11, 2017, Hall et al.
U.S. Appl. No. 16/912,648, filed Jun. 25, 2020, Hall et al.
U.S. Appl. No. 15/926,095, filed Mar. 30, 2018, Hall et al.
U.S. Appl. No. 15/464,227, filed Mar. 30, 2017, Hall et al.
U.S. Appl. No. 15/464,221, filed Mar. 30, 2017, Hall et al.
U.S. Appl. No. 15/974,527, filed May 8, 2018, Hall et al.
U.S. Appl. No. 16/748,498, filed Jan. 21, 2020, Hall et al.
U.S. Appl. No. 15/610,975, filed Jun. 1, 2017, Hall et al.
U.S. Appl. No. 16/546,131, filed Aug. 20, 2019, Hall et al.
U.S. Appl. No. 16/842,491, filed Apr. 7, 2020, Hall et al.
U.S. Appl. No. 16/546,184, filed Aug. 20, 2019, Hall et al.
U.S. Appl. No. 16/546,206, filed Aug. 20, 2019, Hall et al.
U.S. Appl. No. 16/909,306, filed Jun. 23, 2020, Hall et al.
U.S. Appl. No. 15/339,790, filed Oct. 31, 2016, Hall et al.
U.S. Appl. No. 16/854,755, filed Apr. 21, 2020, Hall et al.
U.S. Appl. No. 16/905,843, filed Jun. 18, 2020, Hall et al.
U.S. Appl. No. 16/909,846, filed Jun. 23, 2020, Hall et al.
U.S. Appl. No. 15/835,983, filed Dec. 8, 2017, Hall et al.
U.S. Appl. No. 16/459,557, filed Jul. 1, 2019, Rekow et al.
U.S. Appl. No. 16/841,506, filed Apr. 6, 2020, Rekow et al.
U.S. Appl. No. 16/112,273, filed Aug. 24, 2018, Avlas et al.
U.S. Appl. No. 16/241,849, filed Jan. 7, 2019, Hall et al.
U.S. Appl. No. 16/241,963, filed Jan. 7, 2019, Hall et al.
*Quanergy Systems Inc.* v. *Velodyne Lidar, Inc.* (N.D. Cal.), filed Sep. 13, 2016, U.S. Pat. No. 7,969,558.
*Velodyne Lidar, Inc.* v. *Hesai Photonics Technology Co., Ltd.* (N.D. Cal.), filed Aug. 13, 2019, U.S. Pat. No. 7,969,558.
*Velodyne Lidar, Inc.* v. *Suteng Innovation Technology Co., Ltd.* (N.D. Cal.), filed Aug. 13, 2019, U.S. Pat. No. 7,969,558.
*In re Certain Rotating 3-D Lidar Devices. Components Thereof, and Sensing Systems Containing the Same* (ITC), Investigation No. ITC-337-TA-1173, filed Aug. 15, 2019, U.S. Pat. No. 7,969,558.
Petition for Inter Partes Review (USPTO Patent Trial and Appeal Board), filed Nov. 29, 2017, U.S. Pat. No. 7,969,558.
Inter Parties Review Petition for Inter Partes Review of U.S. Pat. No. 7,969,558 (Claims 1-4, 8, and 9) (IPR No. 2018-00255, *Quanergy Systems, Inc.* v. *Velodyne Lidar, Inc.*) (Nov. 29, 2017), 67 pages. (IPR No. 2018-00255).
Inter Parties Review Replacement Petition for Inter Partes Review of U.S. Pat. No. 7,969,558 (Claims 1-4, 8, and 9), 71 pages. (IPR No. 2018-00255).
Inter Parties Review Patent Owner's Preliminary Response (Public Version—Redacted) (Mar. 7, 2018), 72 pages. (IPR No. 2018-00255).
Inter Parties Review Decision: Institution of Inter Partes Review (May 25, 2018), 11 pages. (IPR No. 2018-00255).
Inter Parties Review Petitioner's Motion to Submit Supplemental Information Pursuant to 37 C.F.R. § 42.123(b) (Aug. 6, 2018), 16 pages. (IPR No. 2018-00255).
Inter Parties Review Decision: Petitioner's Motion to Submit Supplemental Information Pursuant to 37 C.F.R. § 42.123(b) (Aug. 8, 2018), 4 pages. (IPR No. 2018-00255).
Inter Parties Review Patent Owner's Response (Public Version—Redacted) (Sep. 28, 2018), 92 pages. (IPR No. 2018-00255).
Inter Parties Review Patent Owner's Contingent Motion to Amend (Public Version—Redacted) (Sep. 28, 2018), 56 pages. (IPR No. 2018-00255).
Inter Parties Review Petitioner's Unopposed Motion to Submit Replacement Petition and Supplemental Declaration (Nov. 5, 2018), 9 pages. (IPR No. 2018-00255).
Inter Parties Review Petitioner's Reply to Patent Owner's Response (Dec. 21, 2018), 38 pages. (IPR No. 2018-00255).
Inter Parties Review Petitioner Quanergy's Opposition to Patent Owner's Contingent Motion to Amend (Dec. 21, 2018), 35 pages. (IPR No. 2018-00255).
Inter Parties Review Patent Owner's Surreply (Jan. 16, 2019), 50 pages. (IPR No. 2018-00255).
Inter Parties Review Patent Owner's Reply in Support of Its Contingent Motion to Amend (Jan. 16, 2019), 33 pages. (IPR No. 2018-00255).
Inter Parties Review Petitioner Quanergy's Sur-Surreply (Jan. 30, 2019), 9 pages. (IPR No. 2018-00255).
Inter Parties Review Petitioner Quanergy's Surreply to Patent Owner's Contingent Motion to Amend (Jan. 30, 2019), 17 pages. (IPR No. 2018-00255).
Inter Parties Review Petitioner's Updated Exhibit List (Jan. 30, 2019), 13 pages. (IPR No. 2018-00255).
Inter Parties Review Patent Owner's Updated Exhibit List (Feb. 11, 2019), 21 pages. (IPR No. 2018-00255).
Inter Parties Review Record of Oral Hearing (Feb. 27, 2019), 126 pages. (IPR Nos. 2018-00255 and 2018-00256).
Inter Parties Review Final Written Decision (May 23, 2019), 40 pages. (IPR No. 2018-00255).
Inter Parties Review Petitioner's Request for Rehearing (Jun. 24, 2019), 20 pages. (IPR No. 2018-00255).
Inter Parties Review Decision Denying Petitioner's Request for Rehearing (May 21, 2020), 26 pages. (IPR No. 2018-00255).
Inter Parties Review Declaration of Dr. James F. Brennan III (Nov. 29, 2017), 172 pages. (IPR Nos. '255 and '256 Exhibit 1002).
Kilpelä, "Precise pulsed time-of-flight laser range finder for industrial distance measurements," Review of Scientific Instruments (Apr. 2001), 13 pages. (IPR Nos. '255 and '256 Exhibit 1005).
Bordone, et al., "Development of a high-resolution laser radar for 3D imaging in artwork cataloging," Proceedings of SPIE, vol. 5131 (2003), 6 pages. (IPR Nos. '255 and '256 Exhibit 1016).
The American Heritage Dictionary of the English Language, Houghton Mifflin Company, 3d ed. (1996), pp. 1497, 1570, 1697, 1762, and 1804. (IPR Nos. '255 and '256 Exhibit 1018).
Avalanche Photodiode: A User Guide (2011), 8 pages. (IPR Nos. '255 and '256 Exhibit 1019).
Melle, et al., "How to select avalanche photodiodes," Laser Focus World (Oct. 1, 1995), 9 pages. (IPR Nos. '255 and '256 Exhibit 1020).
Aull, et al., "Geiger-Mode Avalanche Photodiodes for Three Dimensional Imaging," Lincoln Laboratory Journal (2002), 16 pages. (IPR Nos. '255 and '256 Exhibit 1021), Lincoln Laboratory Journal, vol. 13, No. 2, 2002, pp. 335-350.
Wikipedia, "Laser" (Nov. 10, 2017), 25 pages. (IPR Nos. '255 and '256 Exhibit 1022).
Internet Archive Web Page: Laser Components (2004), 1 page. (IPR Nos. '255 and '256 Exhibit 1023).
Internet Archive Web Page: Laser Components: High Powered Pulsed Laser Diodes 905D3J08-Series (2004), 6 pages. (IPR Nos. '255 and '256 Exhibit 1024).
U.S. District Court, Claim Construction Order, *Quanergy Systems, Inc.* v. *Velodyne LiDAR, Inc.*, Case No. 5:16-cv-5251-EJD (Oct. 4, 2017), 33 pages. (IPR Nos. '255 and '256 Exhibit 1027).
Internet Archive Webpage: Mercotac 3-Conductor Rotary Electrical Connectors (Mar. 2006), 1 page. (IPR Nos. '255 and '256 Exhibit 1031).
Aood Technology Limited, "*Electrical Slip Rings* vs. *Rotating Electrical Connectors*" (2013), 3 pages. (IPR Nos. '255 and '256 Exhibit 1032).
Yang, et al., "Performance of a large-area avalanche photodiode at low temperature for scintillation detection," Nuclear Instruments and Methods in Physics Research (2003), pp. 388-393 (IPR Nos. '255 and '256 Exhibit 1034).
Thomas, "A procedure for multiple-pulse maximum permissible exposure determination under the Z136.1-2000 American national

(56) References Cited

OTHER PUBLICATIONS standard for safe use of lasers," Journal of Laser Applications, Aug. 2001, vol. 13, No. 4, pp. 134-140.
American National Standards Institute, "Procedures for the Development and Coordination of American National Standards" (Mar. 22, 1995), 50 pages. (IPR Nos. '255 and '256 Exhibit 1040).
Inter Parties Review, Declaration of Dr. Sylvia Hall-Ellis (Nov. 29, 2017), 93 pages. (IPR Nos. '255 and '256 Exhibit 1041).
Ogurtsov, et al., "High Accuracy ranging with Yb3+-doped fiber-ring frequency-shifted feedback laser with phase-modulated seed," Optics Communications (2006), pp. 266-273. (IPR Nos. '255 and '256 Exhibit 1042).
Ou-Yang, et al., "High-dynamic-range laser range finders based on a novel multimodulated frequency method," Optical Engineering (Dec. 2006), 6 pages. (IPR Nos. '255 and '256 Exhibit 1043).
Tarakanov, et al., "Picosecond pulse generation by internal gain switching in laser diodes," Journal of Applied Physics 95:223 (Mar. 2004), pp. 2223-2229. (IPR Nos. '255 and '256 Exhibit 1044).
Japanese Patent Office, Petitioner's Translation of Mizuno Japanese Patent Publication No. H3-6407 (1991), 15 pages. (IPR Nos. '255 and '256 Exhibit 1058).
Inter Parties Review, Redlined Supplemental Declaration of Dr. James F. Brennan III (2018), 171 pages. (IPR Nos. '255 and '256 Exhibit 1062).
Inter Parties Review, Declaration of James F. Brennan, III in Support of Petitioner's Replies and Oppositions to Motions to Amend (Dec. 21, 2018), 93 pages. (IPR Nos. '255 and '256 Exhibit 1063).
Inter Parties Review, Deposition Transcript of J. Gary Eden, Ph.D (taken Nov. 27, 2018), 285 pages. (IPR Nos. '255 and '256 Exhibit 1064).
Inter Parties Review, Declaration of Sylvia Hall-Ellis (Dec. 21, 2018), 146 pages. (IPR Nos. '255 and '256 Exhibit 1065).
Inter Parties Review, Chris Butler Affidavit and Exhibit (Dec. 18, 2018), 33 pages. (IPR Nos. '255 and '256 Exhibit 1066).
Inter Parties Review, Chris Butler Affidavit and Exhibit (Dec. 20, 2018), 52 pages. (IPR Nos. '255 and '256 Exhibit 1067).
Robots for Roboticists, Lidar Fundamentals, http://robotsforroboticists.com/lidar-fundamentals/ (May 5, 2014), 6 pages. (IPR Nos. '255 and '256 Exhibit 1068).
Alhashimi, et al, Statistical Modeling and Calibration of Triangulation Lidars, SCITEPRESS—Science and Technology Publications (2016), pp. 308-317. (IPR Nos. '255 and '256 Exhibit 1069).
USGS, Eros CalVal Center of Excellence (ECCOE), https://calval.cr.usgs.gov/wordpress/wpcontent/uploads/JACIE_files/JAC IE06/Files/312Habib.pdf (Dec. 21, 2018), 3 pages. (IPR Nos. '255 and '256 Exhibit 1071).
Acuity Laser, Principles of Measurement Used by Laser Sensors, https://www.acuitylaser.com/measurement-principles (2018), 4 pages. (IPR Nos. '255 and '256 Exhibit 1075).
Inter Parties Review, Listing of Labelled Substitute Claims (2018), 17 pages. (IPR Nos. '255 and '256 Exhibit 1076).
Fuerstenberg, et al, Multilayer Laserscanner for Robust Object Tracking and Classification in Urban Traffic Scenes, 9th World Congress on Intelligent Transport Systems (2002), 14 pages. (IPR Nos. '255 and '256 Exhibit 1079), pp. 1-10.
Janocha, Actuators: Basics and Applications, Springer (2004), pp. 85-153. (IPR Nos. '255 and '256 Exhibit 1080).
Sick, Sick ToF sensors at close range, https://web.archive.org/web/20040607070720/ http:/www.sick.de:80/de/products/categories/industrial/distancesensors/dme2000/en.html (Jun. 7, 2004), 2 pages. (IPR Nos. '255 and '256 Exhibit 1082).
Daido, Daido steel drilling equipment page, https://web.archive.org/web/20050406120958/ http:/www.daido.co.jp:80/english/products/applipro/energy/dri.html (Apr. 6, 2005), 1 page. (IPR Nos. '255 and '256 Exhibit 1083).
Daido, Daido steel petroleum components, https://web.archive.org/web/20050406121643/ http:/www.daido.co.jp:80/english/products/applipro/energy/petro.htm (Apr. 6, 2005), 1 page. (IPR Nos. '255 and '256 Exhibit 1084).
Daido, Daido steel rebar page, https://web.archive.org/web/20051201010951/ http:/www.daido.co.jp:80/products/stainless/ik_shokai.html (Dec. 1, 2005), 2 pages. (IPR Nos. '255 and '256 Exhibit 1086).
Daido, Daido Special Steel Co. home page, https://web.archive.org/web/20051227070229/http:/daido.co.jp/ (Dec. 27, 2005), 1 page. (IPR Nos. '255 and '256 Exhibit 1087).
Canbus, https://web.archive.org/web/20040520021138/ http:/canbus.us:80/ (May 20, 2004), 3 pages. (IPR Nos. '255 and '256 Exhibit 1088).
Esacademy, Betting on CAN, https://web.archive.org/web/20040609170940/ http:/www.esacademy.com:80/faq/docs/bettingcan/traditional.htm (Jun 9, 2004), 1 page. (IPR Nos. '255 and '256 Exhibit 1089).
Velodyne, Velodyne HDL-64E user manual, https://web.archive.org/web/20081117092628/ http://www.velodyne.com/lidar/products/manual/HDL-64E%20Manual.pdf (Nov. 17, 2008), 23 pages. (IPR Nos. '255 and '256 Exhibit 1090).
Velodyne, Velodyne—High Definition Lidar—Overview https://web.archive.org/web/20071107104255/ http://www.velodyne.com:80/lidar/products/overview.aspx (Nov. 7, 2007), 1 page. (IPR Nos. '255 and '256 Exhibit 1091).
DARPA, 2005 DARPA Challenge Info page https://web.archive.org/web/20051214033009/ http:/www.darpa.mil:80/grandchallenge/ (Nov. 17, 2005), 1 page. (IPR Nos. '255 and '256 Exhibit 1092).
DARPA, 2005 DARPA Team Papers https://web.archive.org/web/20051213010211/ http:/www.darpa.mil:80/grandchallenge/techpapers.html (Dec. 13, 2005), 2 pages. (IPR Nos. '255 and '256 Exhibit 1093).
DARPA, PDF found on Team DAD paper URL, https://web.archive.org/web/20051213015642/ http:/www.darpa.mil:80/grandchallenge/TechPapers/TeamDAD.pdf (Aug. 6, 2005), pp. 1-12. (IPR Nos. '255 and '256 Exhibit 1094).
IBEO, IBEO time of flight with moving graphic, (Jan. 8, 2004), 1 page. (IPR Nos. '255 and '256 Exhibit 1095).
IBEO, IBEO multilayer technology page with moving graphic, Archive.org (Jan. 8, 2004), 1 page. (IPR Nos. '255 and '256 Exhibit 1096).
IBEO, IBEO multilayer tech, (Jan. 8, 2004), 1 page. (IPR Nos. '255 and '256 Exhibit 1097).
IBEO, IBEO Time of Flight, (Jan. 8, 2004), 1 page. (IPR Nos. '255 and '256 Exhibit 1098).
IBEO, IBEO Alasca, https://web.archive.org/web/20031001091407/ http:/www.ibeoas.de:80/html/prod/prod_alasca.html (Oct. 1, 2003), 1 page. (IPR Nos. '255 and '256 Exhibit 1099).
IBEO, IBEO products page, https://web.archive.org/web/20040606115118/ http:/www.ibeoas.de:80/html/prod/prod.html (Jun. 6, 2004), 1 page. (IPR Nos. '255 and '256 Exhibit 1100).
IBEO, IBEO multitarget capability, https://web.archive.org/web/20040323030746/ http:/www.ibeoas.de:80/html/knho/knho_senstech_mlc.html (Mar. 23, 2004), 1 page. (IPR Nos. '255 and '256 Exhibit 1101).
IBEO, IBEO home page, https://web.archive.org/web/20040202131331/ http:/www.ibeo-as.de:8 (Feb. 2, 2004), 1 page. (IPR Nos. '255 and '256 Exhibit 1102).
IBEO, IBEO about page, https://web.archive.org/web/20040606111631/ http:/www.ibeoas.de:80/html/about/about (Jun. 6, 2004), 1 page. (IPR Nos. '255 and '256 Exhibit 1103).
IBEO, IBEO history, https://web.archive.org/web/20040807161657/ http:/www.ibeoas.de:80/html/about/ab_history.html (Aug. 7, 2004), 1 page. (IPR Nos. '255 and '256 Exhibit 1104).
IBEO, IBEO Roadmap, https://web.archive.org/web/20041209032449/ http:/www.ibeoas.de:80/html/prod/prod_roadmap.html (Dec. 9, 2004), 1 page. (IPR Nos. '255 and '256 Exhibit 1105).
Velodyne, Velodyne HDL Applications, https://web.archive.org/web/20080716041931/http://www.velodyne.com:80/lidar/technology/applications.aspx (Jul. 16, 2008), 1 page. (IPR Nos. '255 and '256 Exhibit 1106).
IBEO, IBEO data sheet re available products, https://web.archive.org/web/20041209025137/http://www.ibeoas.de:80/html/prod/prod_dataprices.html (Dec. 9, 2004), 2 pages. (IPR Nos. '255 and '256 Exhibit 1107).

(56) References Cited

OTHER PUBLICATIONS

IBEO, IBEO Available products, https://web.archive.org/web/20041011011528/ http://www.ibeoas.de:80/html/prod/prod.html (Oct. 11, 2004), 1 page. (IPR Nos. '255 and '256 Exhibit 1108).

IBEO, IBEO publications page, https://web.archive.org/web/20031208175052/ http://www.ibeoas.de:80/html/public/public.html (Dec. 8, 2003), 2 pages. (IPR Nos. '255 and '256 Exhibit 1109).

IBEO, IBEO Motiv sensor, https://web.archive.org/web/20040113062910/ http://www.ibeoas.de:80/html/rd/rd_rs_motiv.htm (Jan. 13, 2004), 1 page. (IPR Nos. '255 and '256 Exhibit 1110).

IBEO, IBEO LD Multilayer data sheet, https://web.archive.org/web/20031003201743/ http://www.ibeoas.de:80/html/prod/prod_ld_multi.html (Oct. 3, 2003), 1 page. (IPR Nos. '255 and '256 Exhibit 1111).

Velodynelidar, Data to Improve the Cost, Convenience and Safety of Motor Vehicles, https://velodynelidar.com/industry.html (2018), 6 pages. (IPR Nos. '255 and '256 Exhibit 1125).

Inter Parties Review, Quanergy Systems Inc.'s Invalidity Contentions and Production of Documents Pursuant to Patent Local Rules 3-3 and 3-4, *Quanergy Systems, Inc.* v. *Velodyne LiDAR, Inc.*, Case No. 5:16-cv-5251-EJD (Mar. 27, 2017), 24 pages. (IPR Nos. '255 and '256 Exhibit 1126).

Inter Parties Review, Quanergy Invalidity Contentions Claim Chart, U.S. Pat. No. 7,969,558 (Mizuno), *Quanergy Systems, Inc.* v. *Velodyne LiDAR, Inc.*, Case No. 5:16-cv-5251-EJD (Mar. 27, 2017), 17 pages. (IPR Nos. '255 and '256 Exhibit 1127).

Inter Parties Review, Quanergy Invalidity Contentions Claim Chart, U.S. Pat. No. 7,969,558 (PILAR), *Quanergy Systems, Inc.* v. *Velodyne LiDAR, Inc.*, Case No. 5:16-cv-5251-EJD (Mar. 27, 2017), 13 pages. (IPR Nos. '255 and '256 Exhibit 1128).

Richmond et al., Polarimetric Imaging Laser Radar (PILAR) Program. In Advanced Sensory Payloads for UAV, Meeting Proceedings RTO-MP-SET-092, Paper 19. Neuilly-sur-Seine, France: RTO (May 1, 2005), 35 pages. (IPR Nos. '255 and '256 Exhibit 1129).

Frost et al., Driving the Future of Autonomous Navigation—Whitepaper for Analysis of LIDAR technology for advanced safety, https://velodynelidar.com/docs/papers/FROST-ON-LiDAR.pdf (2016), 30 pages. (IPR Nos. '255 and '256 Exhibit 1130).

irdajp.org, IrDA Infrared Data Association, http://www.irdajp.org/irdajp.info (2018), 3 pages. (IPR Nos. '255 and '256 Exhibit 1134).

Zappa, et al, SPADA: Single-Photon Avalanche Diode Arrays, IEEE Photonics Technology Letters, vol. 17, No. 3 (Mar. 2005), 9 pages. (IPR Nos. '255 and '256 Exhibit 1135).

Dehong, et al, Design and Implementation of LiDAR Navigation System Based on Triangulation Measurement, 29th Chinese Control and Decision Conference (CCDC) (May 2017), 59 pages. (IPR Nos. '255 and '256 Exhibit 1136).

strata-gee.com, Velodyne President Calls Strata-gee to Set the Record Straight, https://www.strata-gee.com/velodyne-president-calls-strata-gee-setrecord-straight/ (Jun. 26, 2014), 6 pages. (IPR Nos. '255 and '256 Exhibit 1137).

Taylor, An Introduction to Error Analysis—The Study of Uncertainties in Physical Measurements, Oxford University Press (1982), pp. 81-137. (IPR Nos. '255 and '256 Exhibit 1138).

American Petroleum Institute, "Specification for Line Pipe," API Specification 5L, 43rd Ed. (2004), 166 pages. (IPR Nos. '255 and '256 Exhibit 1139).

Beer, et al, Mechanics of Materials, McGraw Hill Companies, 4th Ed. (2006), pp. 750 and 752. (IPR Nos. '255 and '256 Exhibit 1140).

National Highway Traffic Safety Administration (NHTSA), DOT, Final Rule Federal Motor Vehicle Safety Standards; Tire Pressure Monitoring Systems Controls and Displays (2005), 222 pages. (IPR Nos. '255 and '256 Exhibit 1141).

American National Standard for Safe Use of Lasers, ANSI Z136.1-2014, Laser Institute of America (Dec. 10, 2013), pp. 27-34 and 216-219. (IPR Nos. '255 and '256 Exhibit 1142).

Business Wire, Press Release Distribution webpage, https://services.businesswire.com/press-release-distribution (Dec. 21, 2018), 2 pages. (IPR Nos. '255 and '256 Exhibit 1143).

Inter Parties Review, Deposition Transcript of J. Gary Eden, Ph.D (taken on Jan. 22, 2019), 368 pages. (IPR Nos. '255 and '256 Exhibit 1150).

Inter Parties Review, Eden Deposition Exhibit 1—Unmanned Vehicles Come of Age: The DARPA Grand Challenge (2006), pp. 26-29. (IPR Nos. '255 and '256 Exhibit 1151).

Inter Parties Review, Eden Deposition Exhibit 2—Driver Reaction Time in Crash Avoidance Research: validation of a Driving Simulator Study on a Test Track; Article in Human Factors and Ergonomics Society Annual Meeting Proceedings, Jul. 2000, 5 pages. (IPR Nos. '255 and '256 Exhibit 1152).

Inter Parties Review, Eden Deposition Exhibit 3—Axis of Rotation diagram (Jan. 22, 2019), 1 page. (IPR Nos. '255 and '256 Exhibit 1153).

Inter Parties Review, Eden Deposition Exhibit 4—Parallel Line and Plane—from Wolfram MathWorld (http://mathworld.wolfram.com/ParallelLineandPlane.html) (Jan. 22, 2019), 1 page. (IPR Nos. '255 and '256 Exhibit 1154).

Inter Parties Review, Eden Deposition Exhibit 5—Quasi-3D Scanning with Laserscanners: Introduction from 2D to 3D (2001), 7 pages. (IPR Nos. '255 and '256 Exhibit 1155).

Inter Parties Review, Eden Deposition Exhibit 6—L-Gage LT3 Long-Range Time-of-Flight Laser Distance-Gauging Sensors (2002), 12 pages. (IPR Nos. '255 and '256 Exhibit 1156).

Inter Parties Review, Eden Deposition Exhibit 7—About Ibeo: Our Mission (https://www.ibeoas.com/aboutibeo) (Jan. 21, 2019), 10 pages. (IPR Nos. '255 and '256 Exhibit 1157).

Inter Parties Review, Eden Deposition Exhibit 8—Automotive Industry; Explore Our Key Industries (https://velodynelidar.com/industry.html) (2019), 6 pages. (IPR Nos. '255 and '256 Exhibit 1158).

Inter Parties Review, Eden Deposition Exhibit 9—Leddar Tech, Solid-State LiDARs: Enabling the Automotive Industry Towards Autonomous Driving (2018), 6 pages. (IPR Nos. '255 and '256 Exhibit 1159).

Inter Parties Review, Eden Deposition Exhibit 10—Are processor algorithms key to safe self-driving cars?—EDN Asia (https: //www.ednasia.com/ news /article/areprocessor-algorithms-key-to-safe-self-driving-cars) (Jul. 7, 2016), 7 pages. (IPR Nos. '255 and '256 Exhibit 1160).

Inter Parties Review, Eden Deposition Exhibit 11—Steve Taranovich's profile (https://www.edn.com/user/steve.taranovich) (Jan. 22, 2019), 4 pages. (IPR Nos. '255 and '256 Exhibit 1161).

Inter Parties Review, Eden Deposition Exhibit 12—Instrumentation and Control (http://www.Instrumentation.co.za /article.aspx?pklarticleid=1664) (Feb. 2002), 4 pages. (IPR Nos. '255 and '256 Exhibit 1162).

Inter Parties Review, Eden Deposition Exhibit 13—IBEO on board: ibeo LUX 4L / ibeo LUX 8L / ibeo LUX HD Data Sheet (Jul. 2017), 2 pages. (IPR Nos. '255 and '256 Exhibit 1163).

Inter Parties Review, Quanergy's Objected-to Demonstrative Slides of Patent Owner (2019), 16 pages. (IPR Nos. '255 and '256 Exhibit 1164).

Inter Parties Review, Declaration of J. Gary Eden, Ph.D. in Support of Patent Owner's Preliminary Responses (Public Version—Redacted) (Mar. 7, 2018), 120 pages. (IPR Nos. '255 and '256 Exhibit 2003).

American National Standard for Safe Use of Lasers, Laser Institute of America (Jun. 28, 2000), 184 pages. (IPR Nos. '255 and '256 Exhibit 2005).

Hamatsu, Opto-Semiconductor Handbook, Si APD, MMPC (Chapter 3), ("APD Handbook"), available at https://www.hamamatsu.com/us/en/hamamatsu/overview/bsd/solid_state_division/related_documents.html (2014), 25 pages. (IPR Nos. '255 and '256 Exhibit 2006).

Berkovic et al., Optical Methods for Distance and Displacement Measurements, Advances in Optics and Photonics (Sep. 11, 2012), pp. 441-471. (IPR Nos. '255 and '256 Exhibit 2007).

Inter Parties Review, Excerpt from Stephan Lugomer, Laser Technology, Laser Driven Processes, Prentice-Hall (1990), pp. 302-311. (IPR Nos. '255 and '256 Exhibit 2008).

Inter Parties Review, Excerpt from James T. Luxon and David E. Parker, Industrial Lasers and Their Applications, Prentice-Hall

(56) References Cited

OTHER PUBLICATIONS (1985), pp. 56, 68-70, 124-125, 145, 150-151, and 154-159. (IPR Nos. '255 and '256 Exhibit 2009).
Inter Parties Review, Excerpt from Raymond T. Measures, Laser Remote Sensing, Fundamentals and Applications (1992), pp. 205 and 213-214. (IPR Nos. '255 and '256 Exhibit 2010).
Inter Parties Review, Excerpt from Peter W. Milonni and Joseph Eberly, Lasers (1988), pp. 585-589. (IPR Nos. '255 and '256 Exhibit 2011).
Inter Parties Review, Excerpt from William V. Smith, Laser Applications (1970), pp. 23-27. (IPR Nos. '255 and '256 Exhibit 2012).
Velodyne Lidar, Webserver User Guide VLP-16 & HDL-32E (63-6266 Rev A) (Nov. 2015), 32 pages. (IPR Nos. '255 and '256 Exhibit 2013).
Inter Parties Review, Excerpt from Beautiful Data, Edited by Toby Segaran and Jeff Hammerbacher (Jul. 2009), pp. 150-153. (IPR Nos. '255 and '256 Exhibit 2014).
Inter Parties Review, Excerpts of Deposition of Craig L. Glennie, Ph.D., *Quanergy Systems, Inc.*, v. *Velodyne Lidar, Inc.*, No. 5:16-cv-05251-EJD (N.D. Cal.) (Jun. 27, 2017), 6 pages. (IPR Nos. '255 and '256 Exhibit 2016).
Velodyne Acoustics, Inc., Motor Specification, Merlin Project, Rev. E1 Initial Engineering Release (Apr. 29, 2009), 1 page. (IPR Nos. '255 and '256 Exhibit 2020).
Velodyne Lidar, CAD Drawing of MotorStat3in, HDL-64E(2018), 1 page. (IPR Nos. '255 and '256 Exhibit 2021).
Velodyne Acoustics, Inc., Motor Winding Specs., P2.0 , E2 Changed Material (Mar. 10, 2010), 1 page. (IPR Nos. '255 and '256 Exhibit 2022).
Velodyne Lidar, Inc., Production Worksheet, Item #30-AD230CER2 in Production, APD, 230UM, Ceramic Submount (Jan. 17, 2018), 1 pages. (IPR Nos. '255 and '256 Exhibit 2023).
Velodyne Lidar, Inc., Production Worksheet Detector, Item #24-AD5009 in Production, AD500-9 NIR Photodiode (Jan. 18, 2018), 1 page. (IPR Nos. '255 and '256 Exhibit 2024).
Velodyne Lidar, CAD Drawing of Rotor, HDL-64E (2018), 1 page. (IPR Nos. '255 and '256 Exhibit 2026).
Velodyne Lidar, CAD Drawing of RotorAl, HDL-64E (2018), 1 page. (IPR Nos. '255 and '256 Exhibit 2027).
Velodyne Lidar Products, PowerPoint (Jan. 18, 2017), 9 pages. (IPR Nos. '255 and '256 Exhibit 2031).
Velodyne Lidar, Ultra Puck™ VLP-32 Data Sheet (2014), 2 pages. (IPR Nos. '255 and '256 Exhibit 2032).
Velodyne Lidar, Excerpts of VLP-32C User Manual, 63-9325 Rev. B (2018), 26 pages. (IPR Nos. '255 and '256 Exhibit 2034).
Velodyne Lidar, First Sensor Annual Report (2016), pp. 1-143. (IPR Nos. '255 and '256 Exhibit 2038).
Overton, First Sensor expands supply agreement for APDs used in Velodyne lidar systems, Laser Focus World (Feb. 15, 2017), 2 pages. (IPR Nos. '255 and '256 Exhibit 2039).
Ohnsman, How a 34-Year-Old Audio Equipment Company is Leading the Self-Driving Car Revolution, Forbes (Aug. 8, 2017), 7 pages. (IPR Nos. '255 and '256 Exhibit 2040).
Ros-Drivers—Error in packet rate for the VLP-32C #142, GitHub Forum (Jan. 29, 2018), 1 page. (IPR Nos. '255 and '256 Exhibit 2041).
Velodyne Lidar, HDL-32E Data Sheet (2017), 2 pages. (IPR Nos. '255 and '256 Exhibit 2042).
Velodyne Lidar, HDL-32E Envelope Drawing (2018), 1 page. (IPR Nos. '255 and '256 Exhibit 2043).
Velodyne Lidar, HDL-32E User's Manual and Programing Guide (Aug. 2016), 29 pages. (IPR Nos. '255 and '256 Exhibit 2044).
Doyle, Velodyne HDL-64E Laser Rangefinder (LIDAR) Pseudo-Disassembled, Hizook (Jan. 4, 2009), 7 pages. (IPR Nos. '255 and '256 Exhibit 2046).
Velodyne Lidar, HDL-64E S2 Datasheet (Mar. 2010), 2 pages. (IPR Nos. '255 and '256 Exhibit 2047).
Velodyne Lidar, HDL-64E S3 Data Sheet (2016), 2 pages. (IPR Nos. '255 and '256 Exhibit 2048).
Velodyne Lidar, HDL-64E S2 and S2.1 User's Manual and Programming Guide (Nov. 2012), 43 pages. (IPR Nos. '255 and '256 Exhibit 2050).
Velodyne Lidar, HDL-64E S3 User's Manual and Programming Guide (May 2013), 54 pages. (IPR Nos. '255 and '256 Exhibit 2051).
Velodyne Lidar, HDL-64E User's Manual (Mar. 2008), 21 pages. (IPR Nos. '255 and '256 Exhibit 2052).
Velodyne Lidar, HDL-32E Supported Sensors, Poly Synch Docs 2.3.2, http://docs.polysync.io/sensors/velodyne-hdl-32e/ (2018), 7 pages. (IPR Nos. '255 and '256 Exhibit 2055).
Glennie et al., Temporal Stability of the Velodyne HDL-64E S2 Scanner for High Accuracy Scanning Applications, MDPI Remote Sensing (Mar. 14, 2011), 15 pages. (IPR Nos. '255 and '256 Exhibit 2057).
Velodyne Lidar, Product Guide (2018), 1 page. (IPR Nos. '255 and '256 Exhibit 2058).
Velodyne Lidar, White Paper, Velodyne's HDL-64E: A High Definition Lidar Sensor for 3-D Applications (Oct. 2007), 7 pages. (IPR Nos. '255 and '256 Exhibit 2059).
Velodyne Lidar, Puck, Real-time 3D LiDAR Sensor, VLP-16 Data Sheet (2017), 2 pages. (IPR Nos. '255 and '256 Exhibit 2060).
Velodyne Lidar, Envelope Hi Res VLP-16 Drawings, Rev. A (Jun. 30, 2016), 4 pages. (IPR Nos. '255 and '256 Exhibit 2061).
Velodyne Lidar, VLP-16 User's Manual and Programming Guide (Mar. 2016), 49 pages. (IPR Nos. '255 and '256 Exhibit 2062).
Velodyne Lidar, CAD Drawing of MotorStat-38in, HDL-64E (2018), 1 page. (IPR Nos. '255 and '256 Exhibit 2063).
Ramsey et al., Use Scenarios to Plan for Autonomous Vehicle Adoption, Gartner (Jun. 26, 2017), 17 pages. (IPR Nos. '255 and '256 Exhibit 2064).
Ford Media Center, Ford Tripling Autonomous Vehicle Development Fleet, Accelerating on-road Testing of Sensors and Software (Jan. 5, 2016), 4 pages. (IPR Nos. '255 and '256 Exhibit 2066).
Velodyne Lidar, HDL-64E Data Sheet (2018), 2 pages. (IPR Nos. '255 and '256 Exhibit 2069).
Velodyne Lidar, It Began With a Race . . . 16 Years of Velodyne LiDAR, Velodyne LiDAR Blog, available at http://velodynelidar.com/blog/it-began-with-a-race/ (2018), 8 pages. (IPR Nos. '255 and '256 Exhibit 2070).
Inter Parties Review, Quanergy M8 Lidar Sensor Datasheet, 2 pages. (IPR Nos. '255 and '256 Exhibit 2071).
D'Allegro, Meet the Inventor Trying to Bring LiDAR to the Masses, the Drive http://www.thedrive.com/sheetmetal/15567/meet-the-inventor-trying-to bring-lidar-to-the-masses (Oct. 28, 2017), 5 pages. (IPR Nos. '255 and '256 Exhibit 2072).
Williams, Driverless cars yield to reality: It's a long road ahead, PC World (Jul. 8, 2013), 6 pages. (IPR Nos. '255 and '256 Exhibit 2073).
Cameron, An Introduction to LIDAR: The Key Self-Driving Car Sensor, Voyage https://news.voyage.auto/an-introduction-to-lidar-the-key-self-drivingcar-sensor-a7e405590cff (May 9, 2017), 14 pages. (IPR Nos. '255 and '256 Exhibit 2074).
Chellapilla, Lidar: The Smartest Sensor on a Self Driving Car, LinkedIn.com https://www.linkedin.com/pulse/lidar-smartest-sensor-self-driving-carkumar-chellapill (Jul. 31, 2017), 8 pages. (IPR Nos. '255 and '256 Exhibit 2075).
Popper, Guiding Light, The Billion-Dollar Widget Steering the Driverless Car Industry, The Verge (Oct. 18, 2017), 17 pages. (IPR Nos. '255 and '256 Exhibit 2076).
Fast Company, The World's 50 Most Innovative Companies 2017, https://www.fastcompany.com/most-innovative-companies/2017 (last visited Feb. 26, 2018), 5 pages. (IPR Nos. '255 and '256 Exhibit 2077).
Velodyne Lidar, Velodyne Donates LiDAR and Robotic Artifacts to Smithsonian, Point of Engineering, Point of Beginning (May 23, 2011), 2 pages. (IPR Nos. '255 and '256 Exhibit 2078).
Informed Infrastructure, Velodyne LiDAR Division Announces Agreement with Caterpillar for Laser Imaging Technology, Informed Infrastructure http://informedinfrastructure.com/25630/velodynes-lidar-divisionannounces-agreement-with-caterpillar-for-laser-imaging-technology-2/ (Aug. 8, 2012), 3 pages. (IPR Nos. '255 and '256 Exhibit 2079).

(56) References Cited

OTHER PUBLICATIONS

Inter Parties Review, Defendant Velodyne's Answer and Counterclaim, *Quanergy Systems, Inc.*, v. *Velodyne Lidar, Inc.*, No. 5:16-cv-05251-EJD (N.D. Cal.) ECF No. 36 (Dec. 5, 2016), 56 pages. (IPR Nos. '255 and '256 Exhibit 2080).

Gargiulo, Velodyne Lidar Tops Winning Urban Challenge Vehicles, Business Wire (Nov. 6, 2007), 2 pages. (IPR Nos. '255 and '256 Exhibit 2082).

Strawa et al., The Measurement of Aerosol Optical Properties Using Continuous Wave Cavity Ring-Down Techniques, 20 Journal of Atmospheric and Oceanic Technology 454 (Apr. 2003), pp. 454-465. (IPR Nos. '255 and 256 Exhibit 2090).

Cheung, Spinning laser maker is the real winner of the Urban Challenge, Tech Guru Daily, available at http://www.tgdaily.com/trendwatch-features/34750-spinning-laser-maker-is-the-real-winner (Nov. 7, 2007), 7 pages. (IPR Nos. '255 and '256 Exhibit 2091).

Velodyne Acoustics, Inc., Outline Drawing HDL-64E S3 Envelope Drawing, Rev. A (Apr. 21, 2015), 1 page. (IPR Nos. '255 and '256 Exhibit 2094).

Businesswire, Velodyne LiDar Awarded "Industry Choice Company of the Year" at TU-Automotive Detroit Conference, Businesswire, https://www.businesswire.com/news/home/20180608005700/en/Velodyne-LiDAR-Awarded-%E2%80%9CIndustry-Choice-Company-Year%E2%80%9D (Jun. 8, 2018), 1 page. (IPR Nos. '255 and '256 Exhibit 2096).

Businesswire, Velodyne Displays Solid State, Highest Performing LiDAR for ADAS, Businesswire https://www.businesswire.com/news/home/20180107005088/en/Velodyne-Displays-Solid-State-Highest-Performing-LiDAR (Jan. 7, 2018), 2 pages. (IPR Nos. '255 and '256 Exhibit 2097).

Brustein et al., How a Billion-Dollar Autonomous Vehicle Startup Lost Its Way, Bloomberg https://www.bloomberg.com/news/features/2018-08-13/how-a-billiondollar-autonomous-vehicle-startup-lost-its-way (Aug. 13, 2018), 7 pages. (IPR Nos. '255 and '256 Exhibit 2098).

Automotive Lidar, Market Presentation titled "Robotic Cars LiDAR Market in Million Dollars" (Apr. 2018), 86 pages. (IPR Nos. '255 and '256 Exhibit 2113).

Velodyne Lidar, VLP-32C User Manual, 63-9325 Rev. B. (Feb. 2, 2018), 136 pages. (IPR Nos. '255 and '256 Exhibit 2114).

Inter Parties Review, Declaration of J. Gary Eden, Ph.D. In Support of Patent Owner's Responses and Motions to Amend (Public Version—Redacted) (Sep. 27, 2018), 202 pages. (IPR Nos. '255 and '256 Exhibit 2115).

Inter Parties Review, Transcript of Sep. 13, 2018 Conference Call, *Quanergy Systems, Inc.* v. *Velodyne Lidar, Inc.*, Nos. IPR2018-00255 and IPR2018-00256 (Sep. 13, 2018), 21 pages. (IPR Nos. '255 and '256 Exhibit 2116).

Hamamatsu, Position Sensitive Detectors ("PSDs") Webpage, One-dimensional and Two-dimensional (Mar. 17, 2006), 1 page. (IPR Nos. '255 and '256 Exhibit 2117).

Hamamatsu, One-dimensional PSD Plastic package, 1-D PSD with plastic package Datasheet ("1-D PSD Datasheet") (2004), 5 pages. (IPR Nos. '255 and '256 Exhibit 2118).

Hamamatsu, One-Dimensional PSD Webpage, One-dimensional (Mar. 17, 2006), 1 page. (IPR Nos. '255 and '256 Exhibit 2119).

Hamamatsu, Two-dimensional PSDs S1200, S1300, S1880, S1881, S2044—Non-discrete position sensor utilizing photodiode surface resistance Datasheet (2003), 6 pages. (IPR Nos. '255 and '256 Exhibit 2120).

Hamamatsu, Two-dimensional PSD S1300 Datasheet (Dec. 19, 2005), 1 page. (IPR Nos. '255 and '256 Exhibit 2121).

Hamamatsu, Two-dimensional PSDs Webpage (Mar. 17, 2006), 1 page. (IPR Nos. '255 and '256 Exhibit 2122).

Hamamatsu, CCD area image sensor S7030/S7031 Series Back-thinned FFT-CCD Datasheet (2006), 8 pages. (IPR Nos. '255 and '256 Exhibit 2123).

Hamamatsu, CCD Image Sensors Webpage ("CCD Image Sensors") (Feb. 2, 2006), 1 page. (IPR Nos. '255 and '256 Exhibit 2124).

Williams, Bias Voltage and Current Sense Circuits for Avalanche Photodiodes—Feeding and Reading the APD, Linear Technology AN92-1 (Nov. 2012), 32 pages. (IPR Nos. '255 and '256 Exhibit 2125).

Hamamatsu, Technical Information, SD-25—Characteristics and use of FFT-CCD area image sensor (Aug. 2003), 27 pages. (IPR Nos. '255 and '256 Exhibit 2126).

Hamamatsu, Technical Information, SD-28—Characteristics and use of Si APD (Avalanche Photodiode) (Aug. 2001), 12 pages. (IPR Nos. '255 and '256 Exhibit 2127).

Hamamatsu, Image Sensor Selection guide (Dec. 2003), 20 pages. (IPR Nos. '255 and '256 Exhibit 2128).

Hamamatsu, Photodiode Technical Information, 18 pages. (IPR Nos. '255 and '256 Exhibit 2129).

Hamamatsu, Silicon Photodiode Array Webpage (Feb. 2, 2006), 1 page. (IPR Nos. '255 and '256 Exhibit 2130).

Piatek, Presentation entitled 'LiDAR and Other Techniques—Measuring Distance with Light for Automotive Industry', authored by Slawomir Piatek, Technical Consultant, Hamamatsu Corp. (Dec. 6, 2017), 66 pages. (IPR Nos. '255 and '256 Exhibit 2131).

Piatek, Measuring distance with light, Hamamatsu.com, https://hub.hamamatsu.com/us/en/application-note/measuringdistance-with-light/index.html (Apr. 2, 2015), 18 pages. (IPR Nos. '255 and '256 Exhibit 2132).

Hergert et al., The WITS$ guide to selecting a photodetector, Hamamatsu.com, https://hub.hamamatsu.com/us/en/technical-note/WITS-guide-detectorselection/index.html (Jul. 2015), 16 pages. (IPR Nos. '255 and '256 Exhibit 2133).

Hamamatsu, Si photodiode array—S4111/S4114 series 16, 35, 46 element Si photodiode array for UV to NIR Datasheet (Jul. 2004), 4 pages. (IPR Nos. '255 and '256 Exhibit 2134).

Hamamatsu, S4111-46Q Si Photodiode Array Webpage (Oct. 22, 2005), 1 page. (IPR Nos. '255 and '256 Exhibit 2135).

Piatek et al., LiDAR: A photonics guide to autonomous vehicle market, Hamamatsu.com, https://hub.hamamatsu.com/us/en/application-note/LiDAR-competingtechnologies-automotive/index.html (Nov. 18, 2017), 6 pages. (IPR Nos. '255 and '256 Exhibit 2136).

Engineering Toolbox, The Engineering Toolbox Copper Tubes—ASTM B88 Datasheet (last accessed Jul. 10, 2018), 4 pages. (IPR Nos. '255 and '256 Exhibit 2137).

The American Society of Mechanical Engineers, Welded and Seamless Wrought Steel Pipe, ASME B36.10M-2004 (Oct. 25, 2004), 26 pages. (IPR Nos. '255 and '256 Exhibit 2138).

Copper Development Association Inc., Copper Tube Handbook—Industry Standard Guide for the Design and Installation of Copper Piping Systems, CDA Publication A4015-14.17: Copper Tube Handbook (2016), 96 pages. (IPR Nos. '255 and '256 Exhibit 2139).

Aufrere, et al., Perception for collision avoidance and autonomous driving, The Robots Institute, Carnegie Mellon University (2003), 14 pages. (IPR Nos. '255 and '256 Exhibit 2140).

Blais, NRC-CNRC, Review of 20 Years of Range Sensor Development, National Research Council Canada (Jan. 2004), pp. 231-243 (IPR Nos. '255 and '256 Exhibit 2141).

Darpa, Grand Challenge '05—Frequently Asked Questions, DARPA.com, http://archive.darpa.mil/grandchallenge05/qa.html) (2005), 3 pages. (IPR Nos. '255 and '256 Exhibit 2143).

DARPA, Urban Challenge, DARPA.com, http://archive.darpa.mil/grandchallenge/ ("DARPA Archive") (2007), 4 pages. (IPR Nos. '255 and '256 Exhibit 2144).

Garmin, How the LIDAR-Lite v3/v3HP works with reflective surfaces, GARMIN.com, https://supportgarmin.com/en-US/?faq=IVeHYIKwChAY0qCVhQiJ67 (last visited Aug. 24, 2018), 2 pages. (IPR Nos. '255 and '256 Exhibit 2145).

Weber, Where to? A History of Autonomous Vehicles, Computer History Museum, https://supportgarmin.com/en-US/?faq=IVeHYIKwChAY0qCVhQiJ67 (May 8, 2014), 23 pages. (IPR Nos. '255 and '256 Exhibit 2146).

Turk, et al., VITS—A Vision System for Autonomous Land Vehicle Navigation, 10 IEEE No. 3 (May 1988), pp. 342-361. (IPR Nos. '255 and '256 Exhibit 2147).

(56) References Cited

OTHER PUBLICATIONS

Amann, Laser ranging: a critical review of usual techniques for distance measurement, 40(1) Society of Photo-Optical Instrumentation Engineers (Jan. 2001), pp. 10-19. (IPR Nos. '255 and '256 Exhibit 2148).

Omron, Technical Explanation for Displacement Sensors and Measurement Sensors, CSM_Displacemente_LineWidth_TG_E_2_1 (2018), 8 pages. (IPR Nos. '255 and '256 Exhibit 2149).

Kaufmann, Choosing Your Detector, OE Magazine (Mar. 2005), 3 pages. (IPR Nos. '255 and '256 Exhibit 2150).

Kaufmann, Light Levels and Noise—Guide Detector Choices, Photonics Spectra 149 (Jul. 2000), 4 pages. (IPR Nos. '255 and '256 Exhibit 2151).

Kilpela, Pulsed Time-of-Flight Laser Range Finder Techniques for Fast, High Precision Measurement Applications (Academic dissertation, University of Oulu) (2004), 98 pages. (IPR Nos. '255 and '256 Exhibit 2152).

Makynen, Position-Sensitive Devices and Sensor System for Optical Tracking and Displacement Sensing Applications (Academic Dissertation, University of Oulu (2000), 121 pages. (IPR Nos. '255 and '256 Exhibit 2153).

MTI Instruments Inc., An Introduction to Laser Triangulation Sensors, https://www.azosensors.com/article.aspx?ArticleID=523 (Aug. 28, 2014), 9 pages. (IPR Nos. '255 and '256 Exhibit 2154).

Panasonic, Measurement Sensors: Specular vs Diffuse, Panasonic Blog, https://na.industrial.panasonic.com/blog/measurement-sensorsspecular-vs-diffuse (Dec. 7, 2011), 2 pages. (IPR Nos. '255 and '256 Exhibit 2155).

Inter Parties Review, Deposition of James F. Brennan, III, *Quanergy Systems, Inc.* v. *Velodyne Lidar, Inc.*, Nos. IPR2018-00255 and IPR2018-00256 (Aug. 23, 2018), 241 pages. (IPR Nos. '255 and '256 Exhibit 2156).

Uwinnipeg, Centripetal Acceleration, Uwinnipeg.ca, http://theory.uwinnipeg.ca/physics/circ/node6.html (1997), 2 pages. (IPR Nos. '255 and '256 Exhibit 2157).

Accetta et al., Active Electro-Optical Systems, The Infrared and Electro-Optical Systems Handbook (1993, ed. by Clifton Fox), pp. 3-76. (IPR Nos. '255 and '256 Exhibit 2158).

Hamamatsu, Image Sensors Webpage (Mar. 17, 2006), 1 page. (IPR Nos. '255 and '256 Exhibit 2160).

Maatta et al., A High-Precision Time-to-Digital Converter for Pulsed Time-of-Flight Laser Radar Applications, 47 IEEE No. 2, 521 (Apr. 1998), pp. 521-536. (IPR Nos. '255 and '256 Exhibit 2161).

English, et al., The Complementary Nature of triangulation and ladar technologies, 5791 Proceedings of SPIE (May 19, 2005), pp. 29-41. (IPR Nos. '255 and '256 Exhibit 2162).

Reymann et al., Improving LiDAR Point Cloud Classification using Intensities and Multiple Echoes, IEE/RSJ International Conference on Intelligent Robots and Systems (Sep. 2015), 8 pages. (IPR Nos. '255 and '256 Exhibit 2167).

Haran et al., Infrared Reflectivy of Pedestrian Mannequin for Autonomous Emergency Braking Testing, IEEE 19th International Conference on Intelligent Transportation Systems (ITSC) (2016), 6 pages. (IPR Nos. '255 and '256 Exhibit 2168).

Song et al., Assessing the Possibility of Land-Cover Classification Using LiDAR Intensity Data, Commission III, PCV02 (2002), 4 pages. (IPR Nos. '255 and '256 Exhibit 2169).

IBEO, IBEO Automobile Sensor GmbH—Scanner Technology webpage (Brennan Deposition Exhibit 1) (Mar. 23, 2004), 1 page. (IPR Nos. '255 and '256 Exhibit 2171).

IBEO, IBEO Automobile Sensor GmbH—The ALASCA project webpage (Brennan Deposition Exhibit 2) (Oct. 6, 2003), 1 page. (IPR Nos. '255 and '256 Exhibit 2172).

Sick LMS200/211/221/291 Laser Measurement Systems—Technical Description (Brennan Deposition Exhibit 3) (2006), 48 pages. (IPR Nos. '255 and '256 Exhibit 2173).

Sick LMS 200/ LMS 211/ LMS 220 / LMS 221/ LMS 291 Laser Measurement Systems—Technical Description (Brennan Deposition Exhibit 4) (Jun. 2003), 40 pages. (IPR Nos. '255 and '256 Exhibit 2174).

Strang, Drawing of cross-section of I-beam by Jonathan Strang (Brennan Deposition Exhibit 5), (2018) 1 page. (IPR Nos. '255 and '256 Exhibit 2175).

Sick Laser Triangulation Sensors Product Information (Brennan Deposition Exhibit 6) (Jun. 25, 2018), 76 pages. (IPR Nos. '255 and '256 Exhibit 2176).

Thin Lens Equation, http://hyperphysics.phyastr.gsu.edu/hbase/geoopt/lenseq.html (last visited Dec. 30, 2018) (Brennan Deposition Exhibit 7), 4 pages. (IPR Nos. '255 and '256 Exhibit 2177).

Inter Parties Review, Images of Generator Rotors (Brennan Deposition Exhibit 8) (2018), 2 pages. (IPR Nos. '255 and '256 Exhibit 2178).

Sick DME 2000 Operating Instructions (Excerpt) (Brennan Deposition Exhibit 9) (May 2002), 42 pages. (IPR Nos. '255 and '256 Exhibit 2179).

Sick Sensick Measuring Distance with Light—Distance Sensors Product Overview (Brennan Deposition Exhibit 10) (2004), 12 pages. (IPR Nos. '255 and '256 Exhibit 2180).

Acuity, Acuity Short Range Sensors Product Information webpage (Brennan Deposition Exhibit 11) (last visited Dec. 30, 2018), 3 pages. (IPR Nos. '255 and '256 Exhibit 2181).

Acuity, Acuity Drill Pipe Runout Product Information webpage (Brennan Deposition Exhibit 12) (last visited Dec. 28, 2018), 2 pages. (IPR Nos. '255 and '256 Exhibit 2182).

Acuity, Acuity AR700 Laser Displacement Sensor Product Information webpage (Brennan Deposition Exhibit 13) (last visited Dec. 28, 2018), 9 pages. (IPR Nos. '255 and '256 Exhibit 2183).

Acuity, Acuity Aluminum Billet Scalping Production Information webpage (Brennan Deposition Exhibit 14) (last visited Dec. 28, 2018), 2 pages. (IPR Nos. '255 and '256 Exhibit 2184).

Kilpela, Excerpt of Pulsed Time-of-Flight Laser Range Finder Techniques for Fast, High Precision Measurement Applications, at Fig. 24 (Academic dissertation, University of Oulu (Brennan Deposition Exhibit 15) (2004), 1 page. (IPR Nos. '255 and '256 Exhibit 2185).

Brennan, Drawing of I-beam by Dr. Brennan (Brennan Deposition Exhibit 16), (Jan. 4, 2019), 1 page. (IPR Nos. '255 and '256 Exhibit 2186).

Yu et al., A New 3D Map Reconstruction Based Mobile Robot Navigation, IEEE (2006), 4 pages. (IPR Nos. '255 and '256 Exhibit 2189).

Furstenberg, et al., New Sensor for 360 Vehicle Surveillance—Innovative Approach to Stop & Go, Lane Assistance and Pedestrian Recognition (May 2001), 5 pages. (IPR Nos. '255 and '256 Exhibit 2190).

Ewald et al., Object Detection with Laser Scanners for Automotive Applications, IFAC Control in Transportation Systems (2000), pp. 369-372. (IPR Nos. '255 and '256 Exhibit 2191).

Fuerstenberg, et al., Pedestrian Recognition and Tracking of Vehicles using a vehicle based Multilayer Laserscanner, IEEE (2002), 12 pages. (IPR Nos. '255 and '256 Exhibit 2192).

Langheim, et al., Sensing of Car Environment at Low Speed Driving, CARSENSE (2002), 14 pages. (IPR Nos. '255 and '256 Exhibit 2193).

Inter Parties Review, Deposition of James F. Brennan, III, *Quanergy Systems, Inc.* v. *Velodyne Lidar, Inc.*, Nos. IPR2018-00255 and IPR2018-00256 (Jan. 4, 2019), 267 pages. (IPR Nos. '255 and '256 Exhibit 2194).

Kluge, Laserscanner for Automotive Applications (May 2001), 5 pages. (IPR Nos. '255 and '256 . Exhibit 2196).

Kaempchen, Feature-Level Fusion of Laser Scanner and Video Data for Advanced Drive Assistance Systems (Ph.D. Dissertation, Ulm University) (2007), 248 pages. (IPR Nos. '255 and '256 Exhibit 2198).

Heenan, et al., Feature-Level Map Building and Object Recognition for Intersection Safety Applications, in Advanced Microsystems for Automotive Applications (Jurgen Valldorf and Wolfgang Gessner eds.) (2005), pp. 505-519. (IPR Nos. '255 and '256 Exhibit 2199).

(56) References Cited

OTHER PUBLICATIONS

Lages, Laserscanner for Obstacle Detection in Advanced Microsystems for Automotive Applications Yearbook (S. Kruger et al. eds.) (2002), pp. 136-140. (IPR Nos. '255 and '256 Exhibit 2200).
Inter Parties Review, Declaration of J. Gary Eden, Ph.D. in Support of Patent Owner's Reply in Support of Its Motion to Amend (Jan. 16, 2019), 71 pages. (IPR Nos. '255 and '256 Exhibit 2202).
Inter Parties Review, PTAB Conference Call, *Quanergy Systems, Inc.* v. *Velodyne Lidar, Inc.*, Nos. IPR2018-00255 and 2018-00256 (Jan. 11, 2019), 27 pages. (IPR Nos. '255 and '256 Exhibit 2204).
Macadam, Understanding and Modeling the Human Driver, 40 Vehicle System Dynamics, Nos. 1-3 (2003), pp. 101-134. (IPR Nos. '255 and '256 Exhibit 2205).
Taranovich, Are processor algorithms key to safe self-driving cars? EDN Asia, https://www.ednasia.com/news/article/are-processor-algorithms-key-tosafe-self-driving-cars (Jul. 7, 2016), 11 pages. (IPR Nos. '255 and '256 Exhibit 2206).
IPO Education Foundation, Inventor of the Year Award, https://www.ipoef.org/inventor-of-the-year/ (2018), 5 pages. (IPR Nos. '255 and '256 Exhibit 2207).
Inter Parties Review, Petition for Inter Partes Review of U.S. Pat. No. 7,969,558 (Claims 16-19 and 23-25) (IPR No. 2018-00256, *Quanergy Systems, Inc.* v. *Velodyne Lidar, Inc.*) (Nov. 29, 2017), 73 pages. (IPR No. 2018-00256).
Inter Parties Review, Replacement Petition for Inter Partes Review of U.S. Pat. No. 7,969,558 (Claims 16-19 and 23-25) (2018) 76 pages. (IPR No. 2018-00256).
Inter Parties Review, Patent Owner's Preliminary Response (Public Version—Redacted) (Mar. 7, 2018), 73 pages. (IPR No. 2018-00256).
Inter Parties Review, Decision: Institution of Inter Partes Review (May 25, 2018), 12 pages. (IPR No. 2018-00256).
Inter Parties Review, Petitioner's Motion to Submit Supplemental Information Pursuant to 37 C.F.R. § 42.123(b) (Aug. 6, 2018), 16 pages. (IPR No. 2018-00256).
Inter Parties Review, Decision: Petitioner's Motion to Submit Supplemental Information Pursuant to 37 C.F.R. § 42.123(b) (Aug. 8, 2018), 4 pages. (IPR No. 2018-00256).
Inter Parties Review, Patent Owner's Response (Public Version—Redacted) (Sep. 28, 2018), 92 pages. (IPR No. 2018-00256).
Inter Parties Review, Patent Owner's Contingent Motion to Amend (Public Version—Redacted) (Sep. 28, 2018), 57 pages. (IPR No. 2018-00256).
Inter Parties Review, Petitioner's Unopposed Motion to Submit Replacement Petition and Supplemental Declaration (Nov. 5, 2018), 9 pages. (IPR No. 2018-00256).
Inter Parties Review, Petitioner's Reply to Patent Owner's Response (Dec. 21, 2018), 37 pages. (IPR No. 2018-00256).
Inter Parties Review, Petitioner Quanergy's Opposition to Patent Owner's Contingent Motion to Amend (Dec. 21, 2018), 35 pages. (IPR No. 2018-00256).
Inter Parties Review, Patent Owner's Surreply (Jan. 16, 2019), 50 pages. (IPR No. 2018-00256).
Inter Parties Review, Patent Owner's Reply in Support of Its Contingent Motion to Amend (Jan. 16, 2019), 33 pages. (IPR No. 2018-00256).
Inter Parties Review, Petitioner's Updated Exhibit List (Jan. 30, 2019), 15 pages. (IPR No. 2018-00256).
Inter Parties Review, Petitioner Quanergy's Sur-Surreply (Jan. 30, 2019), 9 pages. (IPR No. 2018-00256).
Inter Parties Review, Petitioner Quanergy's Surreply to Patent Owner's Contingent Motion to Amend (Jan. 30, 2019), 17 pages. (IPR No. 2018-00256).
Inter Parties Review, Patent Owner's Updated Exhibit List (Feb. 11, 2019), 20 pages. (IPR No. 2018-00256).
Inter Parties Review, Final Written Decision (May 23, 2019), 41 pages. (IPR No. 2018-00256).
Inter Parties Review, Petitioner's Request for Rehearing (Jun. 24, 2019), 20 pages. (IPR No. 2018-00256).
Inter Parties Review, Decision Denying Petitioner's Request for Rehearing (May 21, 2020), 26 pages. (IPR No. 2018-00256).
Besl, Active, Optical Range Imaging Sensors Machine Visions and Applications (1988), Springer-Verlag New York Inc., pp. 1:127-152 (IPR Nos. '255 and '256 Exhibit 1015).
Carson, N. "Defending GPS against the Spoofing Threat using Network Based Detection and 3, 15,20 Successive Interference Cancellation". Auburn University. Nov. 2015, 35 pages.
Excelitas Technologies, "Avalanche Photodiode. A User Guide", 2011 Excelitas Technologies Corp., pp. 1-8.
Hall, et al., Team DAD Technical Paper, DARPA Grand Challenge 2005, XP-002543336, Aug. 26, 2005, pp. 1-12. (IPR Nos. '255 and '256 Exhibit 1081).
U.S. Patent Office, Information Disclosure Statement, U.S. Appl. No. 10/391,383 (U.S. Pat. No. 7,130,672, Pewzner) (Aug. 3, 2005), 8 pages.
U.S. Patent Office, Information Disclosure Statement, U.S. Appl. No. 10/508,232 (U.S. Pat. No. 7,313,424, Mayevsky) (Apr. 21, 2006), 17 pages.
PCT International Search Report and Written Opinion, App. No. PCT/US2018/059452, dated Jan. 16, 2019, 12 pages.
Juberts, et al., "Status report on next generation LADAR for driving unmanned ground vehicles" Mobile Robots XVII, edited by Douglas W. Gage, Proceedings of SPIE, vol. 5609, 2004, pp. 1-12.
Kawata, "Development of ultra-small lightweight optical range sensor system", 2005 IEEE/RSJ International Conference on Intelligent Robots and Systems, Edmonton, AB, Canada, Aug. 2-6, 2005, pp. 58-63 (IPR Nos. '255 and '256 Exhibit 1033).
Laser Components Produkte, Laser Components IG, Inc., 2004, 1 page.
Laser Components, "High Power Pulsed Laser Diodes 905D3J08-Series", Laser Components IG, Inc., 2004, 6 pages.
Liu, et al., "Coupling Study of a Rotary Capacitive Power Transfer System" Industrial Technology, 2009. ICIT 2009. IEEE International Conference, IEEE, Piscataway, NJ, USA, Feb. 10, 2009, pp. 1-6.
Manandhar, "Auto-Extraction of Urban Features from Vehicle-Borne Laser Data", Centre for Spatial Information Science, The University of Tokyo, Japan; Symposium on Geospatial Theory, Processing Applications, Ottawa (2002) 6 pages. (IPR Nos. '255 and '256 Exhibit 1017).
Merriam, How to Use Lidar with the raspberry PI, Hackaday, https://hackaday.com/2016/01/22/how-to-use-lidar-with-the-raspberry-pi/ (Jan. 22, 2016), 13 pages. (IPR Nos. '255 and '256 Exhibit 1072).
Morsy et al., "Multispectral LiDAR Data for Land Cover Classification of Urban Areas," Sensors 17(5), 958 (2017), 21 pages.
Office of the Federal Register National Archives and Records Administration, "Code of Federal Regulations, 21, Parts 800 to 1299, Revised as of Apr. 1, 2005, Food and Drugs", Apr. 1, 2005, pp. 1-23.
Saleh, "Fundamentals of Photonics" vol. 2, Wiley-Interscience Publication, 1991, pp. 342-383, 494-541, and 592-695. (IPR Nos. '255 and '256 Exhibit 1008).
Skolnik, "Radar Handbook" Second Edition, McGraw-Hill Publishing Company, 1990, pp. 1-1191.
The Laser Institute of America, "American National Standard of Safe Use of Lasers" ANSI Z136.1-2000, Revision of ANSI Z136.1-1993, Second Printing 2003, 32 pages.
Westinghouse, "AN/TPS-43 E Tactical Radar System" (1999), pp. 1-14.
PCT International Search Report and Written Opinion, App. No. PCT/US2018/025395, dated Jun. 25, 2018, 14 pages.
PCT International Search Report and Written Opinion, App. No. PCT/US2017/015874, dated May 23, 2017, 12 pages.
PCT International Search Report and Written Opinion, App. No. PCT/US2017/015877, dated Apr. 13, 2017, 13 pages.
PCT International Search Report and Written Opinion, App. No. PCT/US2007/073490, (2008), 10 pages.
PCT International Search Report and Written Opinion, App. No. PCT/US2017/023261, dated May 26, 2017, 11 pages.
PCT International Search Report and Written Opinion, App. No. PCT/US2018/051497, dated Nov. 28, 2018, 11 pages.

(56) References Cited

OTHER PUBLICATIONS

PCT International Search Report and Written Opinion, App. No. PCT/US2019/046422, dated Dec. 3, 2019, 9 pages.
PCT International Search Report and Written Opinion, App. No. PCT/US2018/023283, dated Jun. 1, 2018, 9 pages.
PCT International Search Report and Written Opinion, App. No. PCT/US2017/023259, dated May 31, 2017, 10 pages.
PCT International Search Report and Written Opinion, App. No. PCT/US2017/015869, dated Apr. 10, 2017, 12 pages.
PCT International Search Report and Written Opinion, App. No. PCT/US2018/050934, dated Nov. 20, 2018, 10 pages.
PCT International Search Report and Written Opinion, App. No. PCT/US2010/037129, dated Jul. 27, 2010, 6 pages.
PCT International Search Report and Written Opinion, App. No. PCT/US2017/036865, dated Sep. 26, 2017, 10 pages.
PCT International Search Report and Written Opinion, App. No. PCT/US2017/023262, dated Jun. 5, 2017, 9 pages.
PCT International Search Report and Written Opinion, App. No. PCT/US2017/047543, dated Nov. 27, 2017, 11 pages.
PCT International Search Report and Written Opinion, App. No. PCT/US2018/059062, dated Jan. 16, 2019, 6 pages.
PCT International Search Report and Written Opinion, App. No. PCT/US2019/046573, dated Nov. 15, 2019, 9 pages.
PCT International Search Report and Written Opinion, App. No. PCT/US2019/016259, dated Apr. 26, 2019, 6 pages.
PCT International Search Report and Written Opinion, App. No. PCT/US2019/051729, dated Nov. 20, 2019, 7 pages.
Jelalian, "Laser Radar Systems" (1992), 1 page.
Code of Federal Regulations, Food and Drugs Rule—Performance Standards for Light-Emitting Products, 21 C.F.R. § 1040.10 (2005).
Singh, "Cyclone: A Laser Scanner for Mobile Robot Navigation" (Sep. 1991), pp. 1-18.
Bornstein, "Where am I? Sensors and Methods for Mobile Robot Positioning" (1996), pp. 95-112.
Nagappan, "Adaptive Cruise Control: Laser Diodes as an Alternative to Millimeter Wave Radars" (Sep. 2005), pp. 1-5.
Hancock, "Laser Intensity Based Obstacle Detecting and Tracking" (Jan. 1999), pp. 45-65.
Zhao, "Reconstructing Textured CAD Model of Urban Environment Using Vehicle-Borne Laser Range Scanners and Line Cameras," Lecture Notes in Computer Science, vol. 2095 (2001), pp. 284-297.
Reutebuch, "LiDAR: an Emerging Tool for Multiple Resource Inventory," Journal of Forestry (Sep. 2005) 7 pages.
Zheng, "The Technique of Land 3D Laser Scanning and Imaging Surveying," Railway Aerial Survey, vol. 2 (2003), 3 pages.
Qing, "Method of 3D visualization using laser radar on board of mobile robot," Journal of Jilin University (Information Science Ed.), vol. 22 (Jul. 2004), 4 pages.
Widmann, "Development of Collision Avoidance Systems at Delphi Automotive Systems" (1998), pp. 353-358.
Fischer, "Rapid Measurement and Mapping of Tracer Gas Concentrations in a Large Indoor Space" (May 2000), 27 pages.
Marino, "Jigsaw: A Foliage-Penetrating 3D Imaging Laser Radar System" (2005), pp. 23-36.
Thrun, "Probabilistic Terrain Analysis for High-Speed Desert Driving" (Oct. 2005), 7 pages.
Oshkosh, "Team Terramax: DARPA Grand Challenge 2005" (Oct. 2005), pp. 1-14.
Glennie, Reign of Point Clouds: A Kinematic Terrestrial LiDAR Scanning System (2007), pp. 22-31.
Ullrich, et al., "High-performance 3D-imaging laser sensor," Proceedings of SPIE vol. 3707 (Jun. 1999), pp. 658-664. (IPR Nos. '255 and '256 Exhibit 1014).
Ozguner, "Team TerraMax and the DARPA Grand Challenge: a General Overview," IEEE Intelligent Vehicles Symposium (2004), 6 pages.
Laser Components, https:/web.archive.org/web/20041205172904/http:www.lasercomponents.com (2004), 1 page. (IPR Nos. '255 and '256 Exhibit 1023).

*Quanergy Systems, Inc.* v. *Velodyne LiDAR, Inc.* (N.D. Cal.), Case No. 5:16-cv-05251, "Plaintiff Quanergy Systems, Inc.'s Invalidity Contentions and Production of Documents Pursuant to Patent Local Rules 3-3 and 3-4," Mar. 27, 2017, 24 pages.
*Quanergy Systems, Inc.* v. *Velodyne LiDAR, Inc.* (N.D. Cal.), Case No. 5:16-cv-05251, "Plaintiff Quanergy Systems, Inc.'s Amended Invalidity Contentions Pursuant to Patent Local Rule 3-3," May 23, 2017, 238 pages.
*Quanergy Systems, Inc.* v. *Velodyne LiDAR, Inc.* (N.D. Cal.), Complaint, Case No. 5:16-cv-05251 (Sep. 13, 2016), 21 pages.
*Quanergy Systems, Inc.* v. *Velodyne LiDAR, Inc.* (N.D. Cal.), Case No. 5:16-cv-05251, Amended Complaint, Nov. 18, 2016, 6 pages.
*Quanergy Systems, Inc.* v. *Velodyne LiDAR, Inc.* (N.D. Cal.), Case No. 5:16-cv-05251, Defendant Velodyne's Answer and Counterclaim, Dec. 5, 2016, 20 pages.
*Quanergy Systems, Inc.* v. *Velodyne LiDAR, Inc.* (N.D. Cal.), Case No. 5:16-cv-05251, Answer to Counterclaim, (Jan. 16, 2017) 9 pages.
*Velodyne Lidar, Inc.* v. *Hesai Photonics Technology Co., Ltd.* (N.D. Cal.), Complaint, Case No. 5:19-cv-04742 (Aug. 13, 2019), 13 pages.
*Velodyne Lidar, Inc.* v. *Sunteng Innovation Technology Co., Ltd.* ("Robosense") (N.D. Cal.), Complaint, Case No. 5:19-cv-04746 (Aug. 13, 2019), 13 pages.
Mercotac Model 305, Electrical Slip Rings, https://web.archive.org/web/20060210065251 9/www.mercotac.com/html/305.htm (Feb. 2006), 3 pages.
Mercotac, 3-Conductor Rotary Electrical Connectors https://web.archive.org/web/20060317120209/http://www.mercotac.com:80/html/threeconductor.html (Mar. 2006), 1 page.
McManamon, "Optical Phased Array Technology," Proceedings of the IEEE, vol. 84, No. 2 (Feb. 1996), pp. 268-298.
Chapman, "Introduction to Laser Safety" (Sep. 10, 2007), 19 pages.
Willhoeft et al., "QUASI-3D Scanning with Laserscanners," IBEO Automobile Sensor, 8th World Congress on Intelligent Transport Systems—Quasi-3D Scanning (2001), IBEO Automobile Sensor, 8th World Congress on Intelligent Transport Systems—Quasi-3D Scanning (2001), 12 pages. (IPR Nos. '255 and '256 Exhibit 1077).
Wulf et al., "Fast 3D Scanning Methods for Laser Measurement Systems, CSCS-14, 14th Int'l Conference on Control Systems and Computer Science" (Jul. 2003), pp. 312-317. (IPR Nos. '255 and '256 Exhibit 1078).
Wulf, "2D Mapping of Cluttered Indoor Environments by Means of 3D Perception," Proceedings of the 2004 IEEE International Conference on Robotics & Automation (Apr. 2004), pp. 4204-4209.
Riegl, "Riegl LMS-Z210" (2003), 8 pages.
Spies, "Extended Eyes—Sense and Avoid," Presented at the 2006 International Aerospace Exhibition, Berlin (May 2006), 22 pages.
IBEO, "IBEO multilayer tech" (2004), 1 page.
IBEO, "IBEO Time of Flight" (2004), 1 page.
IBEO, "IBEO products," https://web.archive.org/web/20040606115118/http/:www.ibeoas.de:80/html/prod/prod.html (2004), 1 page.
IBEO, "IBEO multitarget capability," https://web.archive.org/web/20040323030746/, http:/www.ibeoas.de:80/html/knho/knho-senstech-mlc.html (2004), 1 page.
IBEO, "IBEO," https://web.archive.org/web/20040202131331/http:/www.ibeo-as.de:8 (2004), 1 page.
IBEO, "IBEO about," https://web.archive.org/web/20040606111631/http:/www.ibeoas.de:80/html/about/about (2004).
IBEO, "IBEO history," https://web.archive.org/web/20040807161657/,http:/www.ibeoas.de:80/html/about/ab_history.html (2004), 1 page.
IBEO, "IBEO roadmap," https://web.archive.org/web/20041209032449/http:/www.ibeoas.de:80/html/prod/prod_roadmap.html (2004), 1 page.
IBEO, "IBEO data and prices," https://web.archive.org/web/20041209025137/http://www.ibeoas.de:80/html/prod/prod_dataprices.html (2004), 2 pages.
IBEO, "IBEO products," https://web.archive.org/web/20041011011528/http://www.ibeoas.de:80/html/prod/prod.html (2004), 1 page.
IBEO, "IBEO publications," https://web.archive.org/web/20031208175052/http://www.ibeoas.de:80/html/public/public.html (2003), 2 pages.

(56) References Cited

OTHER PUBLICATIONS

IBEO, "IBEO Motiv sensor," https://web.archive.org/web/20040113062910/,http://www.ibeoas.de:80/html/rd/rd_rs_motiv.htm (1997-2000), 1 page.
IBEO, "IBEO LD Multilayer data sheet," https://web.archive.org/web/20031003201743/http://www.ibeoas.de:80/html/prod/prod_ld_multi.html (2003), 1 page.
Fox, "Active electro-optical systems," The infrared and electro-optical systems handbook, vol. 6 (1993), pp. 1-80.
Gustavson, "Diode-laser radar for low-cost weapon guidance," SPIE vol. 1633, Laser radar VII (1992), pp. 1-12.
Skolnik, "Introduction to radar systems," Second edition, McGraw-Hill book company (1980), pp. 1-3.
Trepagnier, "Team gray technical paper," DARPA grand challenge 2005 (Aug. 28, 2005), 14 pages.
Riegl LMS-Q120, http://web.archive.org/web/20050113054822/ http://www.riegl.com/industrial_scanners_/lms_q120_/q120_all_.htm (2005), 4 pages.
Glennie, Performance analysis of a kinematic terrestrial LiDAR scanning system, MAPPS/ASPRS 2006 fall conference (Nov. 6-10, 2006), 9 pages.
Albota, "Three-dimensional imaging laser RADAR with a photon-counting avalanche photodiode array and microchip laser," Applied optics, vol. 41, No. 36 (Dec. 20, 2002), 8 pages.
Marino, "A compact 3D imaging laser RADAR system using Geiger-mode APD arrays: system and measurements," Proceedings of SPIE—The international society for optical engineering (Aug. 2003), 16 pages.
Zhao, "A vehicle-borne urban 3-D acquisition system using single-row laser range scanners," IEEE transactions on systems, man, and cybernetics, vol. 33, No. 4 (Aug. 2003), pp. 658-666.
Fuerstenberg, Pedestrian detection and classification by laserscanners, (2003), 8 pages.
Kohanbash, "LIDAR fundamentals—robots for roboticists" (May 5, 2014), 6 pages.
Sensick, "DME 2000 / DME 3000: Precise non-contact distance determination," Sensick Catalogue (2006), pp. 450-457. (IPR Nos. '255 and '256 Exhibit 1073).
Lamon, "The SmarTer for ELROB 2006—a vehicle for fully autonomous navigation and mapping in outdoor environments" (2005), 14 pages.
Urmson, "High speed navigation of unrehearsed terrain: red team technology for grand challenge 2004" (Jun. 1, 2004), 47 pages.
Ohr, "War raises stakes of next DARPA bot race," EDN (Aug. 15, 2005), 3 pages.
Cravotta, "Operating alone," EDN (Dec. 5, 2005), 6 pages.
International Electrotechnical Commission, "Safety of laser products—part 1: equipment classification and requirements," International Standard IEC 60825-1, edition 1.2 (Aug. 2001), 122 pages.
International Electrotechnical Commission, "Safety of laser products—part 1: equipment classification and requirements," International Standard IEC 60825-1, edition 2.0 (2007), 104 pages.
Stone, "Performance analysis of next-generation LADAR for manufacturing, construction, and mobility" (May 2004), 198 pages.
U.S. International Trade Commission, Investigation No. 337-TA-1173, "Respondent Hesai Photonics Technology Co., Ltd.'s Notice of Prior Art," Nov. 13, 2019, 35 pages.
U.S. International Trade Commission, Investigation No. 337-TA-1173, "Respondent Robosense's Notice of Prior Art," Nov. 13, 2019, 34 pages.
Aiestaran et al. "A Fluorescent Linear Optical Fiber Position Sensor" Elsevier B.V. May 21, 2008 (4 pages).
European Patent Office, Office Action, App. No. EP 11166432.2 (dated Oct. 7, 2019), 6 pages.
Canadian Patent Office, Office Action, App. No. CA 3,012,003 (dated Aug. 28, 2019), 3 pages.
Canadian Patent Office, Office Action, App. No. CA 3,017,735 (dated Aug. 28, 2019), 3 pages.
Canadian Patent Office, Office Action, App. No. CA 3,017,811 (dated Aug. 28, 2019), 3 pages.
European Patent Office, Office Action, App. No. EP 07840406.8 (dated Mar. 15, 2011) 7 pages.
European Patent Office, Office Action, App. No. EP 11166432.2 (dated Jan. 29, 2019), 3 pages.
European Patent Office, Office Action, App. No. EP 11166432.2 (dated Oct. 14, 2016), 4 pages.
European Patent Office, Office Action, App. No. EP 11166432.2 (dated Oct. 5, 2015), 4 pages.
PCT Search Report and Written Opinion (Corrected), App. No. PCT/US2020/026925, dated May 12, 2020, 5 pages.
PCT Search Report and Written Opinion, App. No. PCT/US2020/012633, dated Jun. 2, 2020, 13 pages.
PCT Search Report and Written Opinion, App. No. PCT/US2020/012635, dated Jun. 4, 2020, 10 pages.
Search Report and Opinion, EP App. No. 07840406.8, dated Sep. 8, 2009, 6 pages.
Search Report and Opinion, EP App. No. 11166432.2, dated Jul. 28, 2011, 7 pages.
Search Report and Opinion, EP App. No. 17745112.7, dated Aug. 27, 2019, 8 pages.
Search Report and Opinion, EP App. No. 17770748.6, dated Oct. 22, 2019, 10 pages.
Search Report and Opinion, EP App. No. 17770926.8, dated Oct. 29, 2019, 11 pages.
Search Report and Opinion, EP App. No. 17770928.4, dated Oct. 29, 2019, 10 pages.
Search Report and Opinion, EP App. No. 17807474.6, dated Dec. 9, 2019, 9 pages.
DARPA, Grand Challenge Media—Frequently Asked Questions (Media),DARPA.com, http://archive.darpa.mil/grandchallenge04/media_faq.htm (2004), 3 pages. (IPR Nos. '255 and '256 Exhibit 2142).
Ultra Puck, VLP-32C Data Sheet (2018), 2 pages. (IPR Nos. '255 and '256 Exhibit 2093).
PCT International Search Report and Written Opinion, App. No. PCT/US2018/031682, dated Sep. 17, 2018, 12 pages.
PCT International Search Report and Written Opinion, App. No. PCT/US2017/035427, dated Aug. 29, 2017, 10 pages.
PCT International Search Report and Written Opinion, App. No. PCT/US2019/046412, dated Jun. 24, 2020, 10 pages.
PCT International Search Report and Written Opinion, App. No. PCT/US2019/046419, dated Oct. 29, 2019, 14 pages.
Canadian Patent Office, Office Action, App. No. CA 3,012,003 (dated Sep. 18, 2020), 4 pages.
Canadian Patent Office, Office Action, App. No. CA 3,024,510 (dated Oct. 16, 2020), 6 pages.
European Patent Office, Communication Pursuant to Rules 70(2) and 70a(2) EPC, App. No. 18771534.7 (dated Jan. 14, 2021), 1 page.
European Patent Office, Examination Report, Appl. No. 17745112.7 (dated Jul. 1, 2020), 6 pages.
European Patent Office, Office Action, App. No. 17770748.6 (dated Sep. 14, 2020), 10 pages.
European Patent Office, Office Action, App. No. 17770926.8 (dated Sep. 9, 2020), 5 pages.
European Patent Office, Office Action, App. No. 18886541.4 (dated Jun. 3, 2020), 3 pages.
Extended Search Report, EP App. No. 18774795.1, dated Nov. 11, 20, 9 pages.
Extended Search Report, EP App. No. 18798447.1, dated Dec. 10, 2020, 7 pages.
Glennie, C., et al., "A Comparison of Laser Scanners for Mobile Mapping Applications," Abstract and slides for a presentation given in 2011, 22 pages.
Glennie, C., et al., "Static Calibration and Analysis of the Velodyne HDL-64E S2 for High Accuracy Mobile Scanning," Remote Sensing 2010, 2: pp. 1610-1624.
International Search Report of PCT/CN2019/093266 dated Sep. 30, 2019, 3 pages.
Japanese Patent Office, Notice of Reasons for Rejections, App. No. 2018-549918 (dated Jan. 26, 2021), 4 pages.
Japanese Patent Office, Office Action, App. No. 2019-500215 (dated Dec. 8, 2020), 5 pages.

(56) References Cited

OTHER PUBLICATIONS

Merriam-Webster, Aperture definition, https://web.archive.org/web/20170817144540/https://www.merriam-webster.com/dictionary/aperture (Aug. 17, 2017), 4 pages.
Milenkovic, "Introduction to LIDAR," NEWFOR2014 Summer School (Jul. 2014), 77 pages (IPR. Nos. '255 and '256, Exhibit 2166).
Neff, "The Laser That's Changing the World," Prometheus Books (2018), pp. 193-204 and 270-271.
Russian Patent Office, Office Action, App. No. 2020121407 (dated Jul. 23, 2020), 5 pages.
Satterfield, B., et al., "Advancing Robotics: The Urban Challenge Effect," Journal of Aerospace Computing, Information, and Communication, vol. 5, Dec. 2008, pp. 530-542.
Sick, "Distance Sensors," https://web.archive.org/web/20041213053807/http:/www.Ipc-uk.com:80/sick/sickdist.htm (Dec. 13, 2004), 3 pages.
U.S. International Trade Commission, Investigation No. 337-TA-1173, Appendix B to Respondent's Response to the Complaint and Notice of Investigation, Oct. 21, 2019, pp. 1-4.
U.S. International Trade Commission, Investigation No. 337-TA-1173, "Complainant Velodyne and Respondent Hesai's Joint Notice," Jul. 9, 2020, 3 pages.
U.S. International Trade Commission, Investigation No. 337-TA-1173, "Complainant Velodyne Lidar Inc.'s Motion for Summary Determination," Public Version, Mar. 6, 2020, 168 pages.
U.S. International Trade Commission, Investigation No. 337-TA-1173, "Complainant Velodyne Lidar Inc.'s Opposition to Respondent Hesai's Motion for Summary Determination of Invalidity of U.S. Pat. No. 7,969,558," Public Version, Mar. 18, 2020, 184 pages.
U.S. International Trade Commission, Investigation No. 337-TA-1173, "Complainant Velodyne Lidar Inc.'s Opposition to Respondent Hesai's Motion to Amend," Public Version, Feb. 28, 2020, 108 pages.
U.S. S International Trade Commission, Investigation No. 337-TA-1173, "Complainant Velodyne Lidar, Inc.'s Disclosure of Domestic Industry Products," Nov. 8, 2019, 3 pages.
U.S. International Trade Commission, Investigation No. 337-TA-1173, "Complainant Velodyne Lidar, Inc.'s Motion in Limine No. 3 to Exclude Evidence and Testimony that Krumes Discloses any Limitations of Claims 2 and 9 of the '558 Patent," Sep. 2, 2020, 26 pages.
U.S. International Trade Commission, Investigation No. 337-TA-1173, "Complainant Velodyne's Motion in Limine No. 1 to Limit the Testimony of Robosense's Expert, Jason Janet, PhD.," Public Version, Sep. 2, 2020, 34 pages.
U.S. International Trade Commission, Investigation No. 337-TA-1173, "Complainant Velodyne's Motion in Limine No. 2 to Exclude any Testimony from Dr. Janet Regarding an Alleged Motivation to Combine or Reasonable Expectation of Success," Public Version, Sep. 2, 2020, 22 pages.
U.S. International Trade Commission, Investigation No. 337-TA-1173, "Complainant Velodyne's Supplemental Motion for Summary Determination Regarding Inventorship," Public Version, Sep. 10, 2020, 26 pages.
U.S. International Trade Commission, Investigation No. 337-TA-1173, "Complaint of Velodyne Lidar, Inc. Under Section 337 of the Tariff Act of 1930, as Amended," Aug. 15, 2019, 45 pages.
U.S. International Trade Commission, Investigation No. 337-TA-1173, "Hesai's Motion for Leave to Amend Its Response to the Complaint and Notice of Investigation," Public Version, Feb. 18, 2020, 82 pages.
U.S. International Trade Commission, Investigation No. 337-TA-1173, "Hesai's Unopposed Motion for Leave to File a Reply in Support of Its Motion to Amend Its Response to the Complaint and Notice of Investigation," Public Version, Mar. 6, 2020, 30 pages.
U.S. International Trade Commission, Investigation No. 337-TA-1173, "Initial Determination Granting Joint Motion for Termination of the Investigation as to Respondent Hesai Based on a Settlement and Request for Limited Service of Settlement Agreement under CFR §210.21(b)," Public Version, Jul. 13, 2020, 4 pages.
U.S. International Trade Commission, Investigation No. 337-TA-1173, "Joint Chart of Substantive Legal Issues Being Litigated," Sep. 17, 2020, 5 pages.
U.S. International Trade Commission, Investigation No. 337-TA-1173, "Joint Chart of Substantive Legal Issues Being Litigated," Sep. 8, 2020, 6 pages.
U.S. International Trade Commission, Investigation No. 337-TA-1173, "Joint Motion for and Memorandum in Support of Termination of the Investigation as to Respondent Hesai Based on a Settlement and Request for Limited Service of Settlement Agreement under 19 CFR §210.21(b)," Public Version, Jul. 8, 2020, 77 pages.
U.S. International Trade Commission, Investigation No. 337-TA-1173, "Order No. 26: Granting Hesai's Motion for Leave to Amend Its Response to the Complaint and Notice of Investigation," May 7, 2020, 6 pages.
U.S. International Trade Commission, Investigation No. 337-TA-1173, "Order No. 27: Denying without Prejudice Velodyne's Motion for Summary Determination," Public Version, May 12, 2020, 11 pages.
U.S. International Trade Commission, Investigation No. 337-TA-1173, "Respondent Hesai's Motion for Summary Determination of Invalidity of U.S. Pat. No. 7,969,558," Public Version, Mar. 6, 2020, 109 pages.
U.S. International Trade Commission, Investigation No. 337-TA-1173, "Respondent Robosense's Opposition to Complainant Velodyne's Motion in Limine No. 3 to Exclude Evidence and Testimony That Krumes Discloses Any Limitations of Claims 2 and 9 of the '558 Patent," Sep. 9, 2020, 10 pages.
U.S. International Trade Commission, Investigation No. 337-TA-1173, "Respondent Robosense's Response in Opposition to Complainant Velodyne Lidar, Inc.'s Motion in Limine No. 1," Sep. 9, 2020, 11 pages.
U.S. International Trade Commission, Investigation No. 337-TA-1173, "Respondent RoboSense's Response in Opposition to Complainant Velodyne Lidar, Inc.'s Renewed Motion for Summary Determination Regarding Inventorship," Public Version, Sep. 8, 2020, 12 pages.
U.S. International Trade Commission, Investigation No. 337-TA-1173, "Respondent Robosense's Response in Opposition to Complainants Motion in Limine No. 2," Sep. 9, 2020, 13 pages.
U.S. International Trade Commission, Investigation No. 337-TA-1173, "Respondent Suteng Innovation Technology Co., Ltd.'s Response to the Complaint and Notice of Investigation," Public Version, Oct. 21, 2019, 31 pages.
U.S. International Trade Commission, Investigation No. 337-TA-1173, "Respondents' Memorandum in Opposition to Complainant Velodyne Lidar Inc.'s Motion for Summary Determination," Public Version, Mar. 18, 2020, 190 pages.
U.S. International Trade Commission, Investigation No. 337-TA-1173, "Respondents' Response to the Complaint and Notice of Investigation," Public Version, Oct. 21, 2019, 36 pages.
Velodyne Lidar, Excerpts of Business Records (2007-2012), 2 pages. (IPR Nos. '255 and '256 Exhibit 2084).
Wikipedia, "Cassegrain reflector," Dec. 12, 2014, 5 pages (downloaded from Internet Archive, Sep. 29, 2020).
Written Opinion for PCT/CN2019/093266 dated Sep. 23, 2019, 4 pages.
U.S. Appl. No. 16/931,218, filed Jul. 16, 2020, Hall et al.
U.S. Appl. No. 16/134,068, filed Sep. 18, 2018, Hall et al.
U.S. Appl. No. 16/890,951, filed Jun. 2, 2020, Hall et al.
U.S. Appl. No. 17/255,948, filed Dec. 23, 2020, Xiang et al.
*Quanergy Systems, Inc. v. Velodyne Lidar, Inc.* (Fed. Cir.), filed Jul. 27, 2020, U.S. Pat. No. 7,969,558.

\* cited by examiner

120

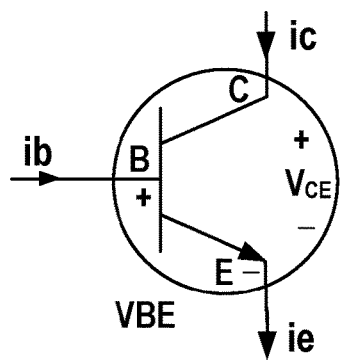

Bipolar Junction Transistor

Currrent Gain = Beta = ic/ib ie = ic +ib

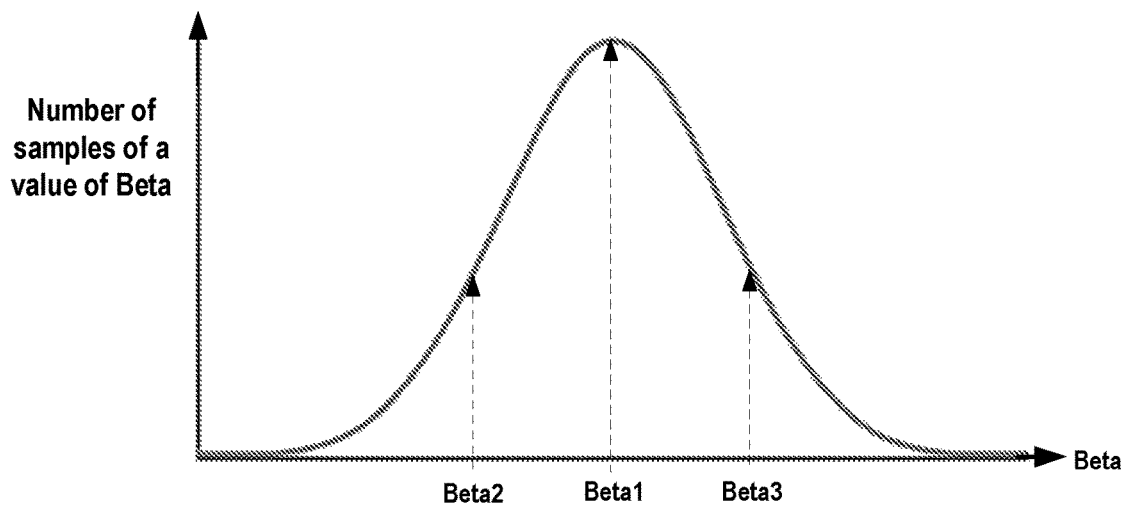

Beta1 has a maximum number of samples of a particular value of beta and represents a nominal value of beta. Beta2 has a lower number of samples of a particular value of beta and represents a reduced value of beta, or a low beta. Beta3 has a higher number of samples of a particular value of beta and represents an increased value of beta, or a high beta

FIG. 1C

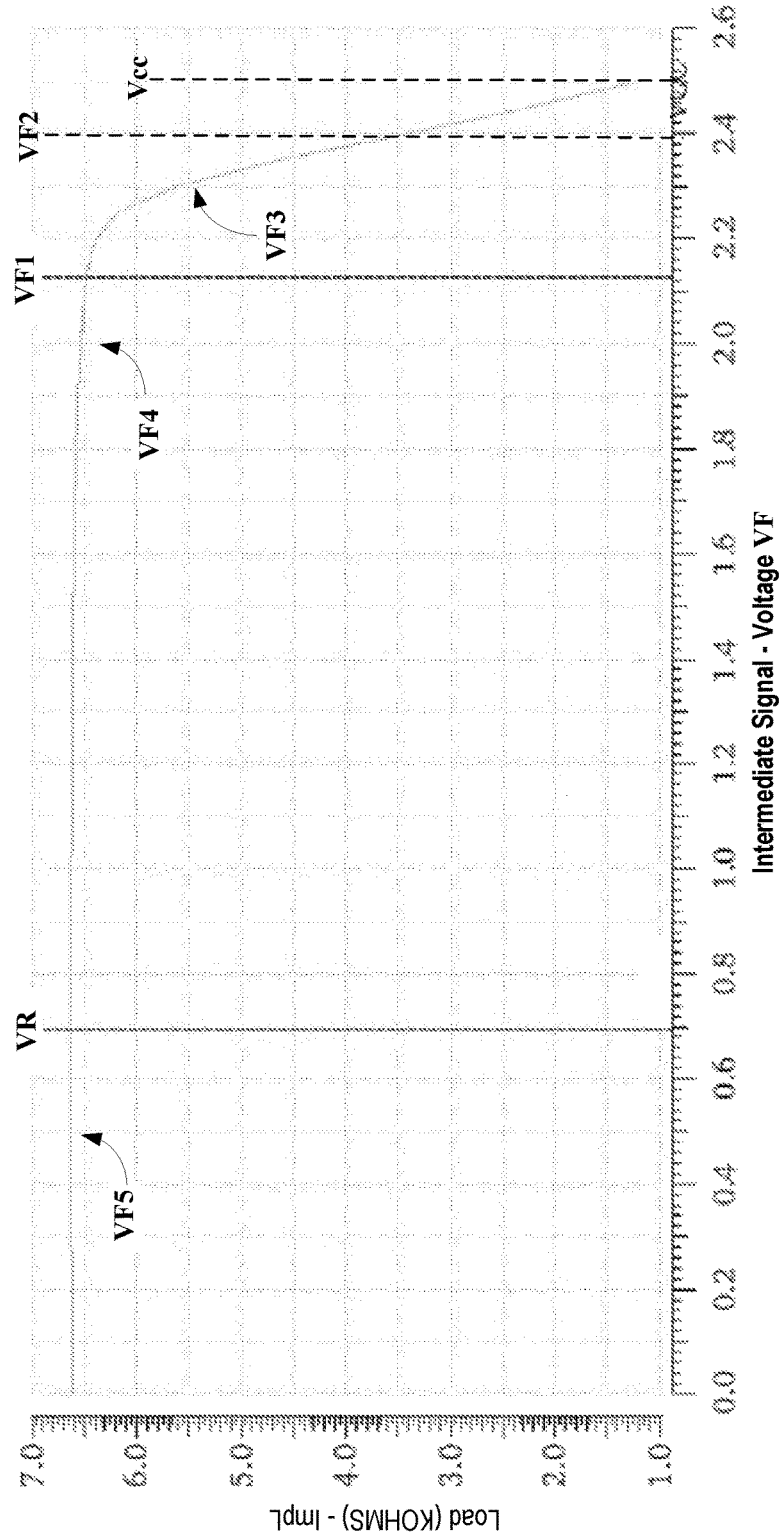

An increase in VF (Intermediate Signal Voltage) relative to the Load (ImpL), may cause a decrease in component performance of a TIA. As illustrated, ImpL is relatively constant at lower VF voltages. At voltage VF1, the ImpL begins to rapidly decrease; at voltage VF2, TIA becomes non-operational; at voltage VF3, TIA is operational but with degraded performance; at voltage VF4, TIA is operational with acceptable performance; VR = Reference Voltage; Vcc = power supply voltage. In sample embodiment 250, VF1 = 2.12 volts; VF2 = 2.4 volts; VF3 = 2.3 volts, VF4 = 2.0 volts; VR = 0.7 volts, Vcc = 2.5 volts. Values are approximate.

As illustrated, a TIA with an intermediate signal voltage of VF3 is operational but with degraded performance. With a calibration method, the TIA can compensate for deficiencies in component performance and reduce the intermediate signal voltage to VF4 to obtain acceptable performance. In some embodiments with a BJT, the component deficiency may be a high beta.

FIG. 2B

SYSTEMS AND METHODS FOR TIA BASE CURRENT DETECTION AND COMPENSATION

BACKGROUND

A. Technical Field

The present disclosure relates generally to systems and methods for transimpedance amplifier (TIA), and more particularly to detect a base current of a bipolar junction transistor (BJT) in a TIA and to adjust the TIA operation to compensate for changing environmental and/or manufacturing conditions.

B. Background

A transimpedance amplifier (TIA) may convert an input current source into an output voltage. The current to voltage gain may be based on a feedback resistance. A TIA may provide simple linear signal processing using an operational amplifier and a feedback resistor for dissipating current. The circuit may be able to maintain a constant voltage bias across the input source as the input current changes, which may be beneficial in a network of sensors. Transimpedance amplifiers may be used to process the current output of photodiodes, pressure transducers, accelerometers, and other types of sensors to a voltage formatted as a useable signal output. However, the performance of a TIA may be negatively impacted by 1) a change in environment, e.g. temperature, and 2) silicon wafer manufacturing variations.

Accordingly, what are needed are systems and methods that may detect performance deficiencies due the aforementioned conditions, and provide a recommendation to select either to discard the TIA or to cause adjustments in the operation of the TIA to improve the performance of the TIA.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not to scale.

FIG. 1B illustrates a schematic of a npn bipolar junction transistors (BJT).

FIG. 1C illustrates a Gaussian distribution of the value of beta (β) according to embodiments of the present disclosure.

FIG. 2B illustrates conditions of operation of a TIA based on the relationship between intermediate signal, (voltageVF), and the impedance of a load of TIA, ImpL.

DETAILED DESCRIPTION OF EMBODIMENTS

Figure 1A:
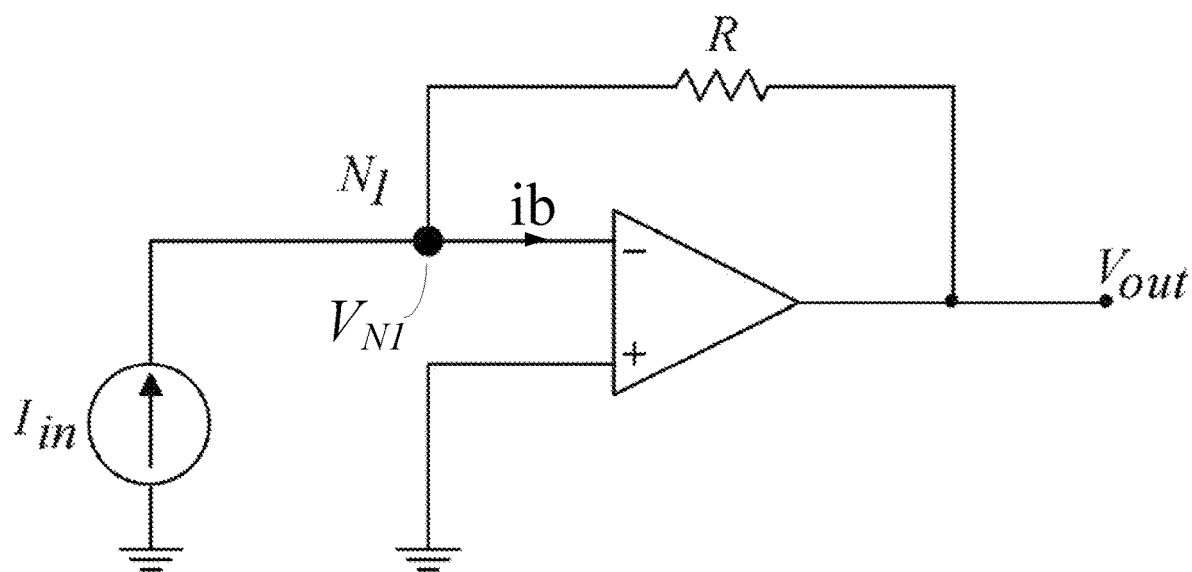
FIG. 1A illustrates a basic transimpedance amplifier circuit according to embodiments of the present document.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists the follow are examples and not meant to be limited to the listed items. Any headings used herein are for organizational purposes only and shall not be used to limit the scope of the description or the claims. Each reference mentioned in this patent document is incorporate by reference herein in its entirety.

Furthermore, one skilled in the art shall recognize that: (1) certain steps may optionally be performed; (2) steps may not be limited to the specific order set forth herein; (3) certain steps may be performed in different orders; and (4) certain steps may be done concurrently.

A. Transimpedance Amplifier (TIA) and Bipolar Junction Transistors (BJT)

A transimpedance amplifier (TIA) may convert current to voltage. TIAs may be used to process the current output of photodiodes, pressure transducers, accelerometers, and other types of sensors to a voltage formatted as a useable signal output. TIAs provide linear signal processing using an operational amplifier and a feedback resistor for dissipating current. FIG. 1A shows a basic transimpedance amplifier circuit 100.

In FIG. 1A, $I_{in}$ represents the current output from a sensor and the gain (sensitivity) is resistance, R. Using Kirchhoff's Current Law (KCL), the sum of all currents flowing into a node is zero. If one assumes that the current flowing into the op amp is ib, KCL at node N1 provides an equation:

$$I_{in} + ((Vout - V_{n1})/R) - ib = 0,$$

as noted in FIG. 1A. The equation provides a voltage output, $Vout = R(ib - I_{in}) + V_{n1}$.

Bipolar Junction Transistor (BJT) is a semiconductor device constructed with three doped Semiconductor Regions (Base, Collector and Emitter) separated by two p-n Junctions. The p-n junction between the Base and the Emitter has a Barrier Voltage ($V_o$) of about 0.6 V to 0.8 V. FIG. 1B illustrates BJT 120 of a npn BJT. As illustrated in FIG. 1B, $V_o = VBE$. A companion BJT has a pnp structure.

Per FIG. 1B, the current flowing out of BJT 120, emitter current ie, is equal to the currents flowing into BJT 120, collector current ic and base current ib; thus the equation: ie=ic+ib. The current gain, or beta, of BJT 120 is equal to the ratio: ic divided by ib (ic/ib). In some embodiments, with a load resistance connected in series with the collector, the current gain (beta) of the common emitter transistor configuration may be quite large. Small changes in current flowing in the base of BJT 120 control the current in the emitter-collector circuit. In some embodiments, beta may have a value between 20 and 200 for general purpose transistors.

The value of beta may vary depending on changes in environment, e.g. 1) temperature, and 2) silicon wafer manufacturing variations. FIG. 1C illustrates a Gaussian distribution of the value of beta 140, according to embodiments of the present disclosure. One sample of the Gaussian distribution is Beta1, which is associated with transistor BJT1. Beta1 represents a nominal value of beta as it has a maximum number of samples for a particular value of beta. Another sample of the Gaussian distribution is associated with transistor BJT2, which has a beta with a value of Beta2. Beta2 has a lower number of samples of a particular value of beta as compared with Beta1 and represents a reduced value of beta, or a "low beta". In some embodiments, since ic is designed to be a constant current, with the lower value of beta (Beta2), the transistor BJT2 may generate a higher value of ib as compared with transistor BJT1 since ic is essentially constant. A decision may be made to discard transistor BJT2 or adjust the TIA to compensate for the higher value of ib.

In another embodiment, a sample of the Gaussian distribution of FIG. 1C is Beta3, which is associated with transistor BJT3. Beta3 has a higher number of samples for a particular value of beta as compared with Beta1, and represents an increased value of beta, or a "high beta". Since ic is generally designed to be a constant current, with the higher value of Beta3, transistor BJT3 may generate a lower value of ib as compared with transistor BJT1, which has a beta of Beta1.

B. TIA Base Current Detection and Compensation Functional Blocks

Figure 2A:
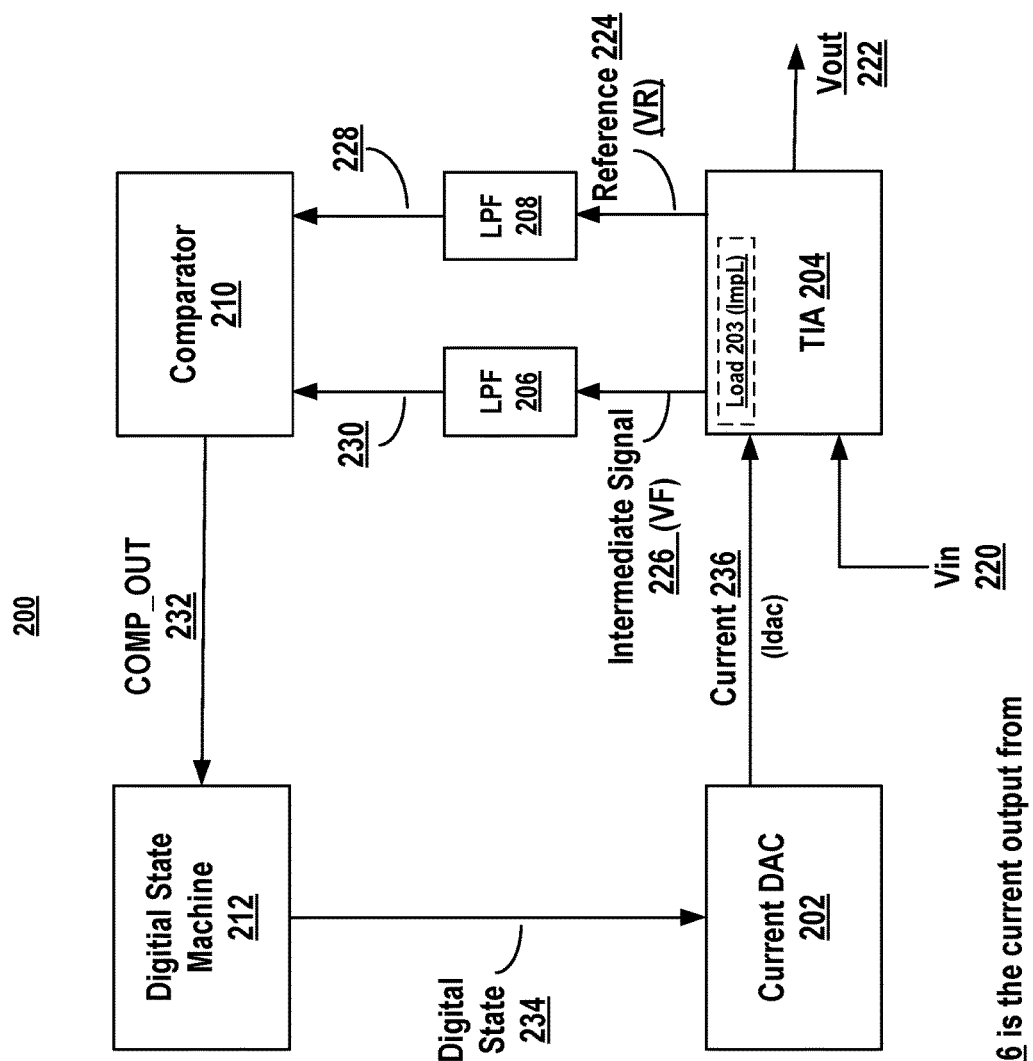
FIG. 2A depicts an implementation of TIA Base Current Detection and Compensation Functional Blocks according to embodiments of the present disclosure.

FIG. 2A depicts TIA Base Current Detection and Compensation Functional Blocks 200, hereinafter, "Functional Blocks 200", according to embodiments of the present disclosure. In operation, Vin 220 is coupled to TIA 204 that amplifies the input current and may generate the voltage, Vout 222. Periodically, there may be a need to update the input current to adapt for changing environmental conditions. In this case, TIA 204 measures the status of its performance based on internally generated Intermediate Signal 226 having an associated voltage, VF. Voltage VF may indicate deficiencies requiring action. Intermediate Signal 226 (voltage VF) and a Reference 224 (voltage VR) are voltages, and are coupled to Comparator 210 via two corresponding low pass filters, LPF 206 and LPF 208 via Signal 228 and Signal 230. Voltage VR is associated with Reference 224. The output of Comparator 210, COMP_OUT 232, may be coupled to Digital State Machine 212. Digital State Machine 212, when triggered, increments the digital state from a current state to a next state. An output of Digital State Machine 212, Digital State 234, may reflect the state of Digital State Machine 212. In one embodiment, Digital State Machine 212 may have 16 states.

If the voltage VF for Intermediate Signal 226 is greater than the voltage VR of Reference 224, the output of Comparator 210 is a "1", which triggers an increment from a current state to a next state in Digital State Machine 212. In one embodiment, the state may change from State2 to State3. Digital State Machine 212 is coupled via Digital State 234 to Current Digital-Analog-Converter (Current DAC) 202. Current DAC 202 then converts the digital state, i.e., Digital State 234, to a current indicated by Current 236, which is the current output from Current DAC 202 (The current of Currrent DAC 202 is referred to as idac). In other words, Current DAC 202 is a state machine controlled low noise current DAC. In some embodiments, the change for State2 to State3 causes an increased value of current for Current 236. Current 236 is in turn coupled to TIA 204. TIA 204 then responds to Current 236 and implements another cycle of comparing voltage VF to voltage VR.

If the voltage VF for Intermediate Signal 226 is less than the voltage VR of Reference 224, the output of Comparator 210 maintains a value of "0". In this case, the state of Digital State Machine 212 remains the same, and there is no change in Current 236.

Functional Blocks 200 may be utilized in a calibration method in order to detect performance deficiencies and provide a recommendation to select either to discard the TIA or to cause adjustments in the operation of the TIA to improve the performance. Performance may be based on the relationship between a load in the TIA and the voltage VF, as discussed relative to FIG. 2B. Key elements in the calibration method are the relationships between current idac, and voltages VF and VR. In a beginning state, idac=0, and VF>VR, causing an increment in the digital code of the state machine (Digital State Machine 234), which causes an increase in idac. Based on the increased idac, the process may repeat. As idac increases, VF decreases. At some point VF<VR, causing the state machine stop incrementing the digital code. At this point, TIA 204 may be considered calibrated and the last digital code is recorded.

With the completion of calibration and the digital code of the state machine recorded, the following decisions may be implemented: (1) compare the recoded digital code to a predetermined code to decide whether to discard the TIA. The predetermined code may be based on design, simulation and expectation parameters. Or, 2) based on the comparison of the recoded digital code to a predetermined code, proceed with operation of the TIA. In this case, the adjusted digital code has compensated for deficiencies in the operation.

An increase in VF may cause degradation in the performance of components of TIA 204. Specifically, the condition of VF being "close" to the supply voltage Vcc may cause TIA 204 to be in a non-operating condition. FIG. 2B illustrates via embodiment 250 the conditions for operation of TIA 204 based on the relationship between Intermediate Signal 226 (voltage VF) and the impedance of a Load 203, ImpL, of TIA 204. The value of the power supply voltage, Vcc and the value of VR are noted on FIG. 2B. As illustrated, at lower values of VF, ImpL is relatively constant, with minimal declines in the value of the impedance. At a higher value of VF, for example, VF1, ImpL begins to rapidly decrease, significantly impacting the components and performance of TIA 204. In some embodiments, VF1 may be 70% of Vcc, a power supply voltage for TIA 204.

When VF increases to a value of VF2, TIA 204 may no longer be operational. The voltage VF2 may be a pre-determined value based on ImpL. This pre-determined value may be based on the design and components of TIA 204. In some embodiments, this pre-determined value of VF2 may be 50% of ImpL. That is, TIA 204 may no longer be operational when ImpL has declined in value by 50%, as illustrated in FIG. 2B.

Alternatively, for pnp bipolar junction transistors, the condition of the value of VF being "low", compared with Vcc may cause the TIA 204 to be in a non-operating condition. In embodiment 250, VF5 illustrates a "low" condition. This condition may occur if VF5 is less than a pre-determined value of Vcc. In some embodiments, pre-determined value of VF5 may be 20%. That is, TIA 204 may be in a non-operating condition when VF5 is 20% of Vcc.

In summary, an increase in VF (Intermediate Signal Voltage) relative to the Load (ImpL) associated with a TIA, may cause a decrease in component performance of a TIA. As illustrated in embodiment 250, ImpL is relatively constant at lower VF voltages. At voltage VF1, the ImpL begins to rapidly decrease; at voltage VF2, TIA becomes non-operational; at voltage VF3, TIA is operational but with degraded performance; at voltage VF4, TIA is operational with acceptable performance; VR=Reference Voltage; Vcc=power supply voltage. Voltage VF4 refers to a range of voltages below VF1. Voltage VF3 refers to a range of voltages between VF1 and VF2. In sample embodiment 250, VF1=2.12 volts; VF2=2.4 volts, VF3=2.3 volts, VF4=2.0 volts; VR=0.7 volts, Vcc=2.5 volts. Values are approximate.

As illustrated in embodiment 250, a TIA with an intermediate signal voltage of VF3 is operational but with degraded performance. With a calibration method, the TIA can compensate for deficiencies in component performance and reduce the intermediate signal voltage to VF4 to obtain acceptable performance. In some embodiments with a BJT, the component deficiency may be a high beta.

C. TIA Base Current Detection and Compensation Circuit

Figure 3:
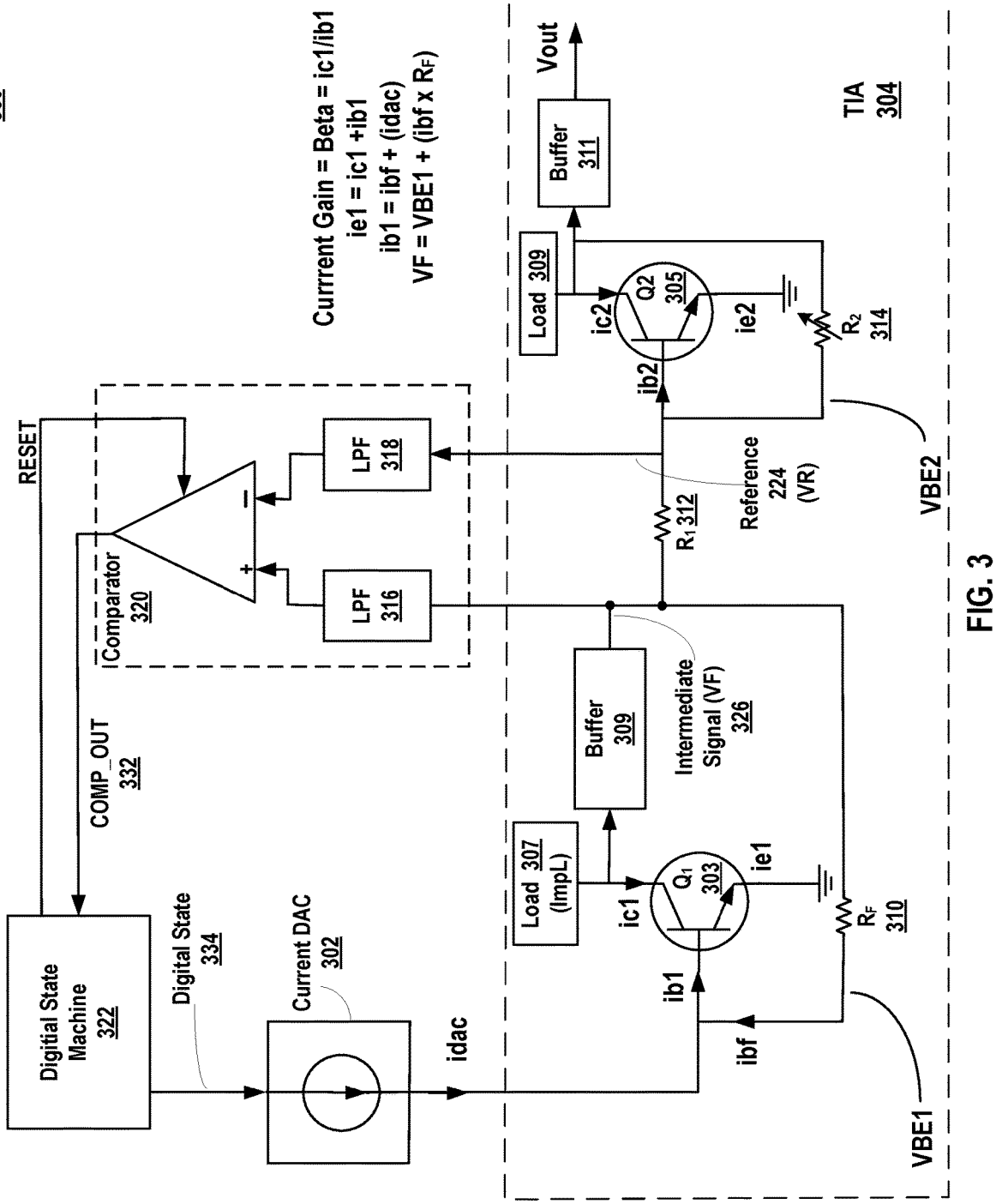
FIG. 3 depicts an implementation of TIA Base Current Detection and Compensation Circuits according to embodiments of the present disclosure.

FIG. 3 depicts TIA Base Current Detection and Compensation Circuits 300 (hereinafter "Circuits 300") according to embodiments of the present disclosure. FIG. 3 includes a BJT implementation of TIA 204 of Functional Blocks 200. Circuits 300 implements detection and compensation of the TIA base current utilizing the properties of a BJT. The voltages, VBE1 and VBE2, are determined primarily by the P-N junction of silicon, which is approximately 0.7 volts (barrier voltage).

Circuit 300 comprises Current DAC 302, TIA 304, Comparator 320, and Digital State Machine 322. TIA 304 comprises several components including two BJTs as illustrated in FIG. 3. One BJT is $Q_1$ 303, which is coupled to a feedback resistor, $R_F$ 310. Associated with these components are: ib1—base current of $Q_1$ 303; ibf—current through resistor $R_F$; idac—current from Current DAC 302, where ib1=ibf+(idac).

An output of Current DAC 302 may be coupled to the base of $Q_1$ 303 and to one end of $R_F$ 310. The collector of $Q_1$ 303 may be coupled to Load 307 and Buffer 311. An output of Buffer 311 may be coupled to the other end of $R_F$ 310, hence providing a feedback resistor for $Q_1$ 303. An output of Buffer 311 is the Intermediate Signal 326 having an associated voltage, VF, where VF=VBE1+(ibf×$R_F$). Intermediate Signal 326 is coupled via $R_1$ 312 to the base of Q2 305. The components Load 309, variable resistor, $R_2$ 314, and Buffer 311 collectively operate to generate Vout, an output of the transimpedance amplifier.

Voltage VF and Voltage VR are separately coupled to Comparator 320, which in turn is coupled via COMP_OUT 332 to Digital State Machine 322, which in turn is coupled to Current DAC 302 via Digital State 334. Current DAC 302 generates idac, which is coupled to the base of Q1 303. The operation of Comparator 320, Digital State Machine 322, and Current DAC 302 are equivalent to the previously described operation of Comparator 210, Digital State Machine 212, and Current DAC 202 as previous described for FIG. 2A. The inputs to Comparator 320 are filtered by LPF 316 and LPF 318.

A goal for the operation of Circuits 300 is the detection of performance deficiencies due to 1) a change in environment, e.g. temperature, and 2) silicon wafer manufacturing variations, and provide a recommendation to select either to discard the TIA or to cause adjustments in the operation of the TIA to achieve an acceptable performance. As previously discussed relative to FIG. 2B, acceptable performance may be defined relative to the relationship between a load of a TIA and the Intermediate Signal Voltage VF. A consideration for Circuits 300 is the neutralization of a "high" ibf current due to a "high" ib1 current caused due to low beta. The operation may be described as follows:

Ib1=ibf+idac

The base current, ib1 is dependent on beta of $Q_1$ 303, which may vary with process and environment, as previously noted. Beta=ic1/ib1

An intermediate signal voltage: VF=VBE1+(ibf× RF)

If the beta is low (decreased), a large base current, ib1, may result, causing a large voltage drop across RF, and may place TIA in a non-operating mode.

If ib1 is high (increased), the level of current "idac" required to make ibf=0 may also be large.

When idac becomes equal to ib1, ibf becomes zero. Then, a further increase in idac may cause ibf to become negative and Comparator 320 will flip, i.e. transition from a "1" to a "0" state. The "1" state may cause Digital State 322 to increment Digital State 334, which in turn increases idac current. The "0" state may cause Digital State 322 to not increment Digital State 334, which in turn results in no change in the idac current. The status of Comparator 320 may be determined based on the value of voltage VF relative to the value of voltage VBE2, where VBE2 is primarily determined by the Barrier Voltage ($V_O$) of about 0.6 V to 0.8 V.

Hence, the value of idac that causes the Comparator 320 to flip or transition indicates a threshold base current. This threshold base current, from the Current DAC 302, may be utilized to decide to neutralize ibf or discard the chip.

Periodic calibration of Circuits 300 may be appropriate to insure proper operation of the TIA. Changing environmental conditions may cause the need for the calibration, which may update the current level.

D. Methods

Figure 4:
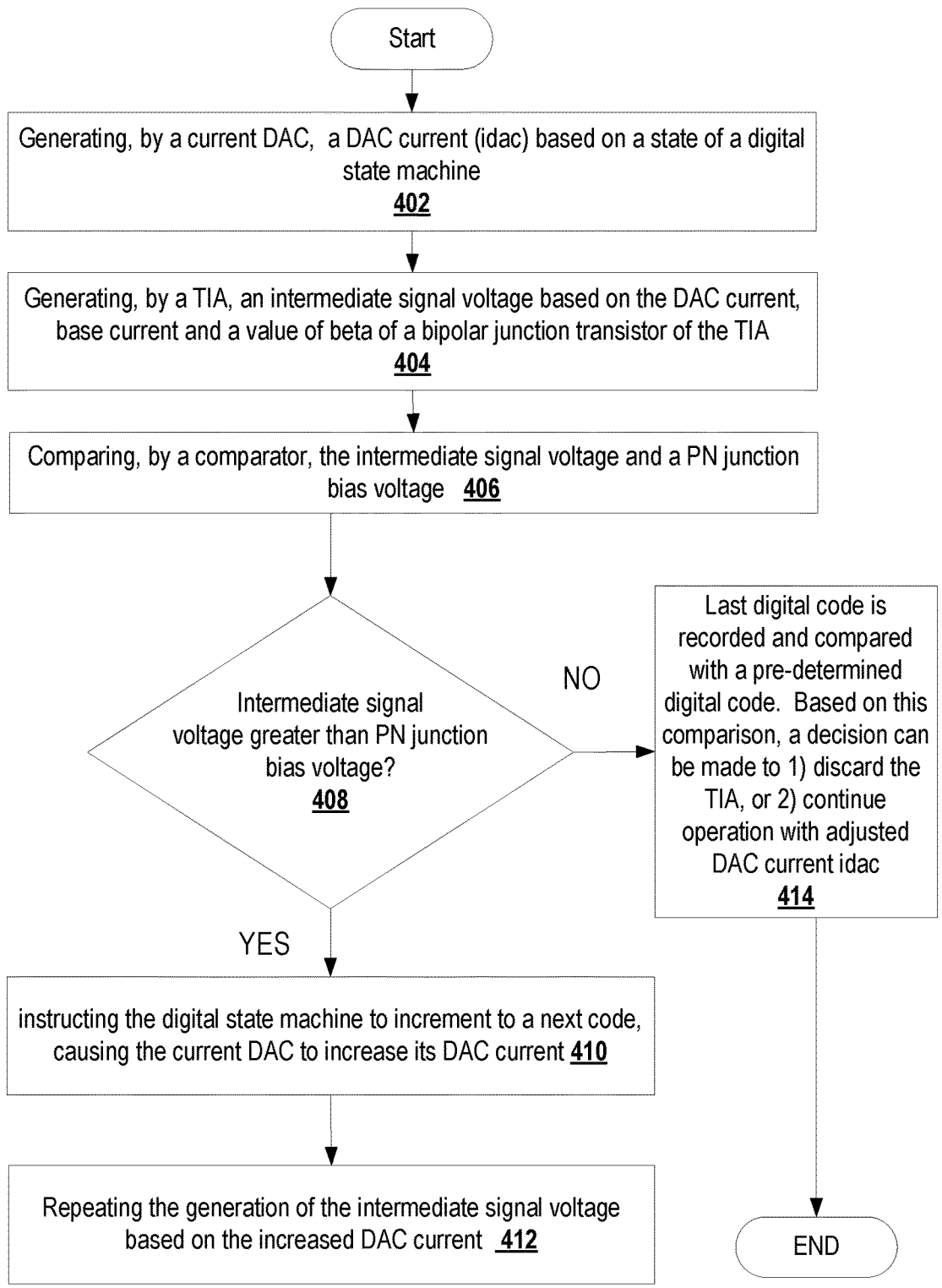
FIG. 4 graphically illustrates a flowchart of a method of calibration to detect and compensate for a high base current in a bipolar junction transistor (BJT) according to embodiments of the current disclosure.

FIG. 4 graphically illustrates a flowchart 400 of a method of calibration to detect and compensate for a high base current in a bipolar junction transistor (BJT) according to embodiments of the current disclosure. The method may be referred to as a calibration process and may be based on utilizing Circuits 300. The method comprises the steps of:

Generating, by a current DAC 302, a DAC current (idac) based on a state of a digital state machine 322 (step 402)

Generating, by a TIA, an intermediate signal voltage VF based on the DAC current, base current ib1 and a value of beta of a bipolar junction transistor $Q_1$ 303 of the TIA. (step 404)

Comparing, by Comparator 320, the intermediate signal voltage VF and a PN junction bias voltage. (step 406)

Is the intermediate signal voltage VF greater than the PN junction bias voltage? (step 408)

If yes, the output of the comparator changes state, instructing a digital state machine to increment to a next digital code (or state of Digital State Machine 212), causing the current DAC to increase its DAC current idac (step 410)

Then, repeating the generation of the intermediate signal voltage VF based on the increased DAC current idac (step 412)

If no, the last digital code is recorded and compared with a pre-determined digital code. Based on this comparison, a decision can be made to 1) discard the TIA, or 2) continue operation with adjusted DAC current idac. (step 414)

As previously discussed for FIG. 2B, an increase in VF may cause degradation in the performance of components of TIA 204. Specifically, the condition of VF being "close" to the supply voltage Vcc may cause TIA 204 to be in a non-operating condition. FIG. 2B illustrates conditions for operation of TIA 204 based on the relationship between Intermediate Signal 226 VF and the impedance of a Load 203, ImpL, of TIA 204.

In summary, A system for detecting and adjusting the operation of a TIA comprises (1) a current digital to analog converter (DAC) operable to generate an idac current based on a first state level of a digital state machine; (2) a transimpedance amplifier (TIA) operable to receive the current and to generate an intermediate signal voltage (VF) and generate an output voltage (Vout); (3) a comparator operable to receive the intermediate signal voltage (VF) and a reference voltage and generate an output; and (4) the digital state machine operable to generate second state level based on the output of the comparator. The current DAC changes its idac generated current if there is a difference between the first state level and the second state level.

If the intermediate signal voltage is greater than the reference voltage, the output of the comparator is a "1", causing the digital state machine to increment the first state level to a higher level state for the second state, in turn causing the current DAC to increase the idac current coupled to the TIA. If the intermediate signal voltage is less than the reference voltage, the output of the comparator is a "0", causing no change in the state level of the digital state machine, and causing no change to idac current coupled to the TIA. The reference voltage is based on a barrier voltage of a bipolar junction transistor (BJT). The barrier voltage varies between 0.6 voltages and 0.8 voltages.

The TIA comprises a first bipolar junction transistor (BJT), and the intermediate signal voltage (VF) is based in part on the value of beta of the first BJT. A first base current (ib1) for the first BJT is equal to the current from the current DAC (idac) plus a feedback current (ibf) received via a feedback resistor, wherein the intermediate signal voltage (VF) equals the barrier voltage plus the feedback current (ibf) times the resistance of the feedback resistor. When VF increases to a pre-determine value, the impedance of the load of the TIA decreases, causing the TIA to no longer operate. If the digital state machine increments to the higher level state, the idac current increases, and the TIA repeats the generation of another value of the intermediate signal voltage (VF) utilizing the increased idac current. If the digital state machine does not increment to a higher level state, a current state is recorded and compared with a pre-determined state, and wherein, based on the comparison, a decision is made to 1) discard the TIA, or 2) continue operation with last adjusted idac current. An operation status of the TIA is based on a relationship between intermediate signal voltage (VF) and an impedance of a load of the TIA, wherein an increase in intermediate signal voltage (VF) causes degradation in the operation status of the TIA.

A variation of a beta of the first BJT causes an inverse variation of the intermediate signal voltage that in turn causes a change in the first base current (ib1) for the first BJT, wherein the change in the first base current (ib1) compensates for the variation in the beta. The reference voltage is based on the barrier voltage of a second BJT in the TIA. The current to voltage gain may be based on a feedback resistance. A goal for the operation of the system is the neutralization of a high ibf current due to a large ib1 current.

A method for detecting and adjusting the operation of a TIA comprises generating a DAC current by a current DAC and coupling the DAC current to a transimpedance amplifier (TIA); generating, by the TIA, an intermediate signal voltage (VE) based on the DAC current, a base current and a value of beta of a bipolar junction transistor of the TIA; comparing, by a comparator, the intermediate signal voltage (VF) and a PN junction bias voltage.

If the intermediate signal voltage is greater than the PN junction bias voltage, the output of the comparator changes, instructing a digital state machine to increment to a next digital code, causing the current DAC to increase its DAC current; and repeating the generation of the intermediate signal voltage (VF) based on the increased DAC current. If the intermediate signal voltage (VF) is not greater than a PN junction bias voltage, recording the last digital code and comparing the last digital code with a pre-determined digital code.

E. System Embodiments

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A system comprising:
   a current digital to analog converter (DAC) operable to generate an idac current based on a first state level of a digital state machine;
   a transimpedance amplifier (TIA) operable to receive the idac current and to generate an intermediate signal voltage (VF) and generate an output voltage (Vout);
   a comparator operable to receive the intermediate signal voltage (VF) and a reference voltage and generate an output; and the digital state machine operable to generate a second state level based on the output of the comparator,
wherein, the current DAC changes its generated idac current if there is a difference between the first state level and the second state level.

2. The system of claim 1, wherein if the intermediate signal voltage (VF) is greater than the reference voltage, the output of the comparator is a "1", causing the digital state machine to increment a digital state from the first state level to the second state level, in turn causing the current DAC to increase the idac current.

3. The system of claim 2, wherein if the digital state machine increments the digital state, the idac current increases, and the TIA repeats generation of another value of the intermediate signal voltage (VF) utilizing the increased idac current.

4. The system of claim 1, wherein if the intermediate signal voltage (VF) is less than the reference voltage, the output of the comparator is a "0", causing no change in a state level of the digital state machine, and causing no change to idac current coupled to the TIA.

5. The system of claim 4, wherein, if the digital state machine does not increment to a higher level state, a current state is recorded and compared with a pre-determined state, and wherein, based on the comparison, a decision is made to 1) discard the TIA, or 2) continue operation with last adjusted idac current.

6. The system of claim 1, wherein the TIA comprises a first bipolar junction transistor (first BJT), and the intermediate signal voltage (VF) is based in part on a value of beta of the first BJT.

7. The system of claim 6, wherein a first base current (ib1) for the first BJT is equal to the current from the idac current plus a feedback current (ibf) received via a feedback resistor, wherein the intermediate signal voltage (VF) equals a voltage VBE1, which is primarily based on a barrier voltage, plus the feedback current (ibf) times a resistance of the feedback resistor.

8. The system of claim 7, wherein a decrease in the value of beta of the first BJT, that causes an increase in the first base current (ib1), is neutralized by incrementing a digital state of the digital state machine in order to increase the idac current.

9. The system of claim 7, wherein when the idac current equals the first base current (ib1), then the idac current increases in value to cause feedback current (ibf) to become negative, the comparator to transitions from a "1" to a "0".

10. The system of claim 6, wherein a variation of a beta of the first BJT causes an inverse variation of the intermediate signal voltage (VF) that in turn causes a change in a first base current (ib1) for the first BJT, wherein the change in the first base current (ib1) compensates for the variation in the beta.

11. The system of claim 6, wherein the value of beta may vary depending on changes in environment, e.g. 1) temperature, and 2) silicon wafer manufacturing variations.

12. The system of claim 1, wherein the reference voltage is based on a barrier voltage of a second BJT in the TIA.

13. The system of claim 1, wherein an operation status of the TIA is based on a relationship between the intermediate signal voltage (VF) and an impedance of a load of the TIA.

14. The system of claim 13, wherein when VF increases to a pre-determine value, the impedance of the load of the TIA decreases, causing the TIA to no longer operate.

15. A method comprising:
generating a DAC current by a current DAC and coupling the DAC current to a transimpedance amplifier (TIA);
generating, by the TIA, an intermediate signal voltage (VF) based on the DAC current, a base current and a value of beta of a bipolar junction transistor of the TIA;
comparing, by a comparator, the intermediate signal voltage (VF) and a reference voltage;
if the intermediate signal voltage (VF) is greater than the reference voltage and an output of the comparator changes, instructing a digital state machine to increment to a next digital code, causing the current DAC to increase its DAC current; and
repeating the generation of the intermediate signal voltage (VF) based on the increased DAC current.

16. The method of claim 15, further comprising:
if the intermediate signal voltage (VF) is not greater than the reference voltage, recording a last digital code and comparing the last digital code with a pre-determined digital code.

17. The method of claim 16, further comprising:
based on the comparison, deciding to 1) discard the TIA, or 2) continue operation with adjusted DAC current.

18. The method of claim 15, wherein the bipolar junction transistor is a first bipolar junction transistor, and wherein the reference voltage is a bias voltage across a PN junction of a second bipolar junction transistor of the TIA.

19. A system comprising:
a current digital to analog converter (DAC) operable to generate an idac current based on a first state level of a digital state machine;
a transimpedance amplifier (TIA) comprising a first bipolar junction transistor (BJT) having an associated load, and a second BJT, operable to receive the idac current and to generate an intermediate signal voltage (VF) and generate an output voltage (Vout);
a comparator operable to receive the intermediate signal voltage (VF) and a reference voltage and generate an output; and
the digital state machine operable to generate a second state level based on the output of the comparator,
wherein, the current DAC changes its generated idac current if there is a difference between the first state level and the second state level.

20. The system of claim 19, wherein when VF increases to a pre-determine value, an impedance of the associated load of the TIA decreases, causing the TIA to no longer operate.

21. The system of claim 19, wherein if the intermediate signal voltage (VF) is greater than the reference voltage, the output of the comparator is at a "STATE1", causing the digital state machine to increment a digital state from the first state level to the second state level, in turn causing the current DAC to increase the idac current, wherein if the intermediate signal voltage (VF) becomes less than the reference voltage, the output of the comparator is a "STATE2", causing no change in a state level of the digital state machine, and causing no change to idac current coupled to the TIA.

* * * * *